(12) United States Patent
Kim

(10) Patent No.: US 11,048,585 B2
(45) Date of Patent: Jun. 29, 2021

(54) STORAGE DEVICE AND OPERATING METHOD THEREOF

(71) Applicant: SK hynix Inc., Icheon-si (KR)

(72) Inventor: Ju Hee Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 33 days.

(21) Appl. No.: 16/680,838

(22) Filed: Nov. 12, 2019

(65) Prior Publication Data
US 2020/0319964 A1    Oct. 8, 2020

(30) Foreign Application Priority Data
Apr. 3, 2019    (KR) .......................... 10-2019-0039089

(51) Int. Cl.
| | | |
|---|---|---|
| *G06F 11/10* | (2006.01) | |
| *H03M 13/11* | (2006.01) | |
| *G06F 12/0882* | (2016.01) | |
| *G06F 13/16* | (2006.01) | |
| *G06F 11/14* | (2006.01) | |

(52) U.S. Cl.
CPC ........ *G06F 11/1068* (2013.01); *G06F 11/102* (2013.01); *G06F 11/1489* (2013.01); *G06F 12/0882* (2013.01); *G06F 13/1668* (2013.01); *H03M 13/1105* (2013.01)

(58) Field of Classification Search
CPC .............. G06F 11/1068; G06F 11/102; G06F 11/1489; G06F 12/0882; G06F 13/1668; H03M 13/1105
USPC .............. 714/764, 768, 773, 796, 770, 799; 365/185.09, 200, 201
See application file for complete search history.

(56) References Cited

U.S. PATENT DOCUMENTS 8,149,618 B2 *  4/2012  Kang ..................... G11C 16/26
                                                365/185.03
8,902,674 B2 * 12/2014  Yang ................... G11C 11/5642
                                                365/189.05
(Continued)

FOREIGN PATENT DOCUMENTS

KR    10-2017-0075065    7/2017
KR    10-2018-0003320    1/2018

OTHER PUBLICATIONS

Liao et al., Data Analysis and Prediction for NAND Flash Decoding Status, 2017, IEEE, pp. 1-4. (Year: 2017).*

*Primary Examiner* — John J Tabone, Jr.
(74) *Attorney, Agent, or Firm* — Perkins Coie LLP

(57) ABSTRACT

A memory controller includes: a read operation controller for controlling the plurality of memory devices to perform read operation on a plurality of pages included in one stripe; an over-sampling read voltage determiner for determining over-sampling read voltages, based on soft read data of a selected page among at least two pages, when read operations on the at least two pages among the plurality of pages fail; an error bit recovery for recovering error estimation bits included in read data of the selected page, based on an over-sampling read data of the selected page, which is acquired using the over-sampling read voltages; and an error corrector for performing error correction decoding on conversion data obtained by recovering the error estimation bits included in the read data of the selected page. The plurality of pages included in one stripe is included in different memory devices among the plurality of memory devices.

20 Claims, 21 Drawing Sheets

(56) References Cited

U.S. PATENT DOCUMENTS

| | | | |
|---|---|---|---|
| 2008/0205152 A1* | 8/2008 | Kang | G11C 11/5642 |
| | | | 365/185.18 |
| 2008/0209111 A1* | 8/2008 | Kang | G11C 11/5642 |
| | | | 711/103 |
| 2012/0147671 A1* | 6/2012 | Kang | G11C 16/26 |
| | | | 365/185.03 |
| 2012/0269007 A1* | 10/2012 | Yang | G11C 7/00 |
| | | | 365/189.05 |
| 2019/0108092 A1* | 4/2019 | Lee | G06F 11/1012 |

* cited by examiner

FIG. 10
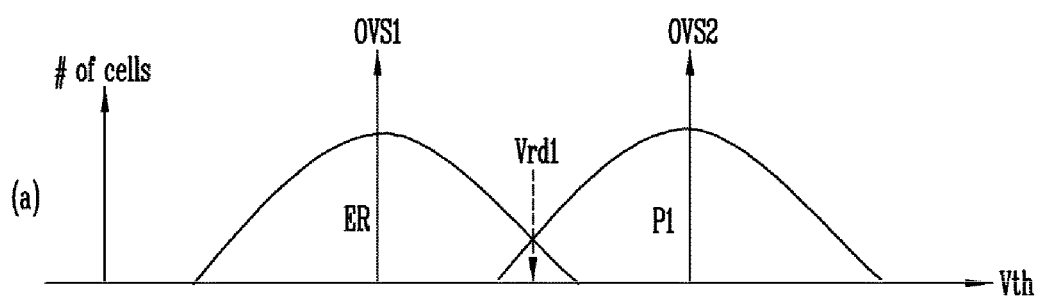
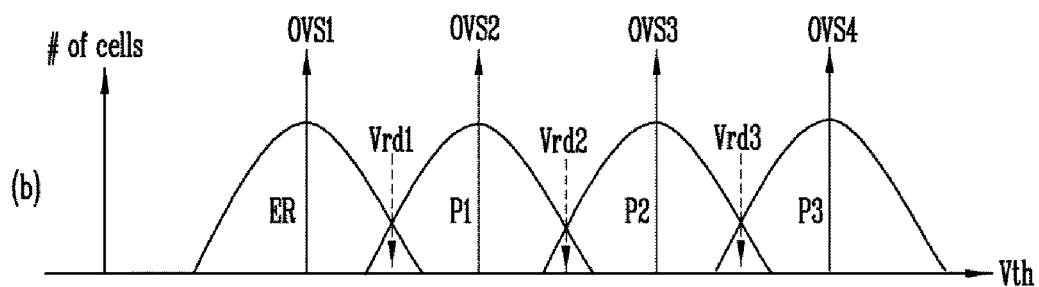

STORAGE DEVICE AND OPERATING METHOD THEREOF

CROSS-REFERENCE TO RELATED APPLICATION

This patent document claims priority to and benefits of the Korean patent application number 10-2019-0039089, filed on Apr. 3, 2019, which is incorporated herein by reference in its entirety.

TECHNICAL FIELD

The disclosed technology generally relates to an electronic device, and more particularly, to a storage device and an operating method thereof.

BACKGROUND

A storage device is a device that can store data in a storage medium. Computing devices such as a personal computer or a smart-phone can use such storage devices to retain data files. The storage device may include a memory device for storing data and a memory controller for controlling the memory device to store and retrieve data in and from the memory device. The memory device is classified into a volatile memory device and a nonvolatile memory device.

The volatile memory device can retain data only when power is supplied, and will lose data when the supply of power is interrupted. Examples of the volatile memory device may include a static random access memory (SRAM) and a dynamic random access memory (DRAM).

The nonvolatile memory device can retain data even when the supply of power is interrupted. Examples of the nonvolatile memory device may include a read only memory (ROM), a programmable ROM (PROM), an electrically programmable ROM (EPROM), an electrically erasable ROM (EEROM), and a flash memory.

SUMMARY

The embodiments disclosed in this patent document provide a storage device having improved data recovery capability and an operating method thereof.

In some embodiments of the disclosed technology, there is provided a memory controller for controlling a plurality of memory devices, the memory controller including: a read operation controller configured to control the plurality of memory devices to perform read operation on a plurality of pages included in one stripe; an over-sampling read voltage determiner configured to determine over-sampling read voltages, based on soft read data of a selected page among at least two pages, when read operations on the at least two pages among the plurality of pages fail; an error bit recovery configured to recover error estimation bits included in read data of the selected page, based on an over-sampling read data of the selected page, which is acquired using the over-sampling read voltages; and an error corrector configured to perform error correction decoding on conversion data obtained by recovering the error estimation bits included in the read data of the selected page, wherein the plurality of pages are respectively included in different memory devices among the plurality of memory devices.

In some embodiments of the disclosed technology, there is provided a method for operating a memory controller for controlling a plurality of memory devices, the method including: acquiring read data as a result obtained by performing read operations on a plurality of pages included in one stripe; acquiring soft read data as a result obtained by performing a soft read operation on a selected page among at least two pages, when read operations on the at least two pages among the plurality of pages fail; determining over-sampling read voltages, based on the soft read data; acquiring over-sampling data as a result obtained by performing on over-sampling read operation on the selected page, using the over-sampling read voltages; generating conversion data obtained by recovering error estimation bits included in read data of the selected page, based on the over-sampling read data; and performing error correction decoding on the conversion data, wherein the plurality of pages are respectively included in different memory devices among the plurality of memory devices.

In some embodiments of the disclosed technology, there is provided a storage device including: a plurality of memory devices; and a memory controller configured to control the plurality of memory devices to perform read operation on a plurality of pages included in one stripe, determine over-sampling read voltages, based on soft read data of a selected page among at least two pages, when read operations on the at least two pages among the plurality of pages fail, recover error estimation bits included in read data of the selected page, based on an over-sampling read data of the selected page, which is acquired using the over-sampling read voltages, and perform error correction decoding on conversion data obtained by recovering the error estimation bits included in the read data of the selected page, wherein the plurality of pages are respectively included in different memory devices among the plurality of memory devices.

In some embodiments of the disclosed technology, there is provided a method for operating a storage device including a plurality of memory devices and a memory controller for controlling the plurality of memory devices, the method including: performing read operations on a plurality of pages included in one stripe; performing a soft read operation on memory cells of a selected page among at least two pages, when read operations on the at least two pages among the plurality of pages fail; determining over-sampling read voltages, based on soft read data as a result obtained by performing the soft read operation; performing an over-sampling read operation on the selected page by using the over-sampling read voltages; generating conversion data obtained by recovering error estimation bits included in read data of the selected page, based on over-sampling read data as a result obtained by performing the over-sampling read operation; and performing error correction decoding on the conversion data, wherein the plurality of pages are respectively included in different memory devices among the plurality of memory devices.

In some embodiments of the disclosed technology, a memory controller for controlling a plurality of memory devices includes a read operation controller configured to control the plurality of memory devices to perform a read operation on a plurality of pages included in one stripe of the plurality of memory devices, an over-sampling read voltage determiner configured to determine over-sampling read voltages, based on soft read data of a selected page among at least two pages, when read operations on the at least two pages among the plurality of pages fail, an error bit recovery configured to recover error estimation bits included in read data of the selected page, based on an over-sampling read data of the selected page acquired using the over-sampling read voltages, and an error corrector configured to perform error correction decoding on conversion data obtained by recovering the error estimation bits included in the read data of the selected page.

In some embodiments of the disclosed technology, a storage device includes a plurality of memory devices, and a memory controller in communication with the plurality of memory devices to perform read operation on a plurality of pages included in one stripe of the plurality of memory devices, determine over-sampling read voltages, based on soft read data of a selected page among at least two pages, when read operations on the at least two pages among the plurality of pages fail, recover error estimation bits included in read data of the selected page, based on an over-sampling read data of the selected page acquired using the over-sampling read voltages, and perform error correction decoding on conversion data obtained by recovering the error estimation bits included in the read data of the selected page.

In some embodiments of the disclosed technology, a memory controller for controlling a plurality of memory devices includes a read operation controller in communication with the plurality of memory devices to perform a read operation on a plurality of pages included in one stripe of the plurality of memory devices, an over-sampling read voltage determiner configured to determine over-sampling read voltages, based on soft read data of a selected page among at least two pages, when read operations on the at least two pages among the plurality of pages fail, an error bit recovery configured to recover error estimation bits included in read data of the selected page, based on an over-sampling read data of the selected page acquired using the over-sampling read voltages, and an error corrector configured to perform error correction decoding on conversion data obtained by recovering the error estimation bits included in the read data of the selected page. The plurality of pages included in one stripe is included in different memory devices among the plurality of memory devices.

In some embodiments of the disclosed technology, a method for operating a memory controller for controlling a plurality of memory devices includes acquiring read data by performing read operations on a plurality of pages included in one stripe, acquiring soft read data by performing a soft read operation on a selected page among at least two pages, when read operations on the at least two pages among the plurality of pages fail, determining over-sampling read voltages, based on the soft read data, acquiring over-sampling data by performing on over-sampling read operation on the selected page, using the over-sampling read voltages, generating conversion data obtained by recovering error estimation bits included in read data of the selected page, based on the over-sampling read data, and performing error correction decoding on the conversion data. The plurality of pages included in one stripe is included in different memory devices among the plurality of memory devices.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration.

FIG. 10 is a diagram illustrating examples of a read voltage and an over-sampling read voltage.

DETAILED DESCRIPTION

The specific structural or functional description disclosed herein is merely illustrative for the purpose of describing embodiments according to the concept of the disclosed technology. The embodiments according to the concept of the disclosed technology can be implemented in various forms, and cannot be construed as limited to the embodiments set forth herein.

Hereinafter, exemplary embodiments of the disclosed technology will be described in detail with reference to the accompanying drawings in order for those skilled in the art to be able to readily implement the technical spirit of the disclosed technology.

Figure 1:
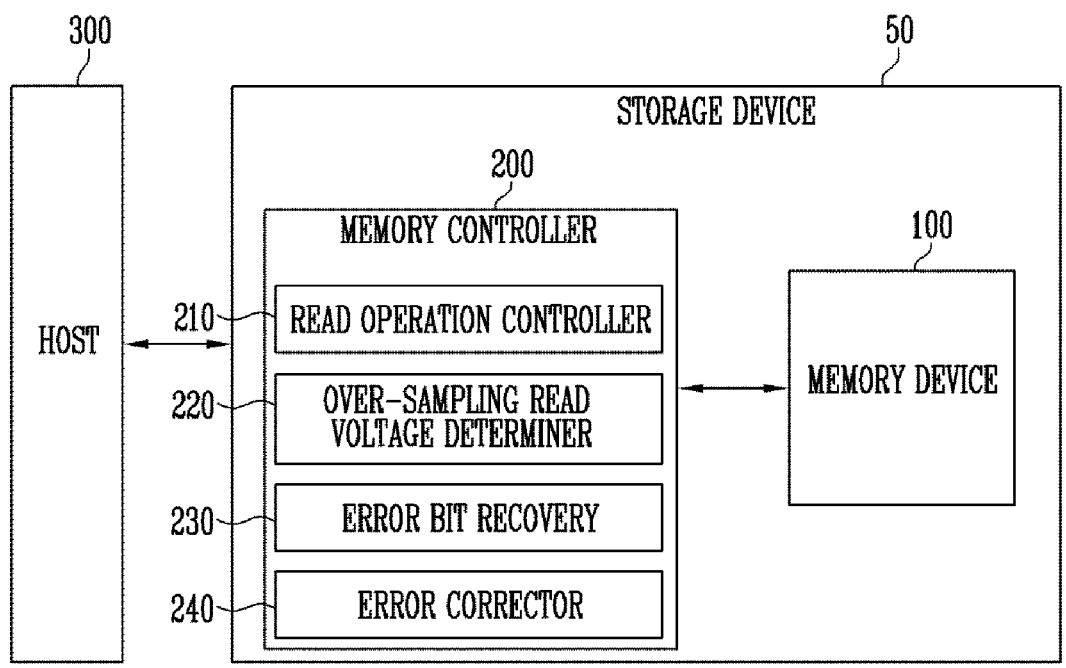
FIG. 1 is a diagram illustrating an example of a storage device based on an embodiment of the disclosed technology.

FIG. 1 is a diagram illustrating an example of a storage device based on an embodiment of the disclosed technology.

A storage device 50 may include a memory device 100 and a memory controller 200 configured to perform operations on the memory device 100. The storage device 50 may store data responsive to requests from a host 300, such as a mobile phone, a smart phone, an MP3 player, a laptop computer, a desktop computer, a game console, a TV, a tablet PC or an in-vehicle infotainment.

The storage device 50 may be consumer devices or enterprise storage devices. There are a number of storage device types depending on which host interface is used to communicate with the host 300. In this regard, the storage device 50 may be implemented as any storage device type. In the context of this patent document, the expression "storage device" has to be understood broadly and includes a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

There are different types of packages that can be used to manufacture the storage device 50. Such package types include Package-On-Package (POP), System-In-Package (SIP), System-On-Chip (SOC), Multi-Chip Package (MCP), Chip-On-Board (COB), Wafer-level Fabricated Package (WFP), and Wafer-level Stack Package (WSP).

The storage device 50 may store data in the memory device 100. The memory device 100 operates under the control of the memory controller 200. The memory device 100 may include a memory cell array including a plurality of memory cells for storing data. The memory device 100 may be a storage space where data to be processed and/or instructions to be executed are stored, and the memory controller 200 may include the logic needed to read and write to the memory device 100.

Each of the memory cells may be capable of storing one or more bits of data. A single level cell (SLC) stores a single bit of data, a multi-level cell (MLC) stores two bits of data, a triple level cell (TLC) stores three bits of data, and a quad level cell (QLC) stores four bits of data.

The memory cell array may be organized in memory blocks with multiple pages per block. In an embodiment, the memory device 100 perform write or read operations on a page basis and perform erase operations on a block basis.

In an embodiment of the disclosed technology, the memory device 100 may include a plurality of memory dies, and the memory controller 200 may control the plurality of memory dies of the memory device 100. As discussed above, memory cells in each memory die may be organized into a plurality of memory blocks, and, in some implementations, the plurality of memory blocks may be grouped into super blocks. A super block may include a set of blocks from the same memory die and/or different memory dies. In some implementations, memory blocks in a super block scatter the bits of error correction code word across multiple memory blocks of a super block. In this way, if a memory block or a memory die fails, the data it was storing can be recovered from other memory blocks and/or other memory dies, which is often called "chip kill" error correction scheme. In some implementations, the chip kill error correction scheme involves an XOR operation over data in a super block. In some implementations, the pages from the blocks in a super block may be grouped into a plurality of stripes. In some implementations, the stripe may be a set of pages coupled to the same word line among pages included in the super block.

A stripe may include a set of pages from different memory dies of the memory devices 100. In some implementations, the pages from the blocks in a super block are grouped into stripes. In some implementations, one page in a super block may store data obtained by performing an exclusive or (XOR) operations on data stored in the other pages in the super block.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 to allow the memory controller 200 to access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may write data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100. In an implementation where the memory devices 100 include flash memory devices (e.g., SSDs, USB flash drives, SD/MMC cards or eMMC chips), a flash translation layer (FTL) may be situated in the memory controller 200 to implement logical-to-physical mapping, garbage collection, wear leveling management, and bad block management, for example. As an example, the FTL may provide an interface between a host interface layer and a flash interface layer.

In an embodiment, the memory controller 200 may receive data and a logical block address (LBA) from the host 300, and translate the LBA into a physical block address (PBA) representing addresses of memory cells where actual memory cells to write data to or read data from are located in the memory device 100. In some implementations, the FTL may include a logical-physical mapping table such as a mapping table for logical to physical (L2P) mapping that maps a logical address to a corresponding physical address.

The memory controller 200 may control the memory device 100 to perform various operations such as a program operation, a read operation, and an erase operation in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data regardless of a request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control more than one memory device 100. The memory controller 200 may utilize an interleaving scheme in controlling the memory devices to improve operational performance. The interleaving scheme may improve system performance by performing more than one operation at a given time frame. For example, the interleaving scheme may perform operations on two or more memory devices 100 at the same time by interleaving a part of a queue associated with a memory device with a part of another queue associated with another memory device.

In an embodiment, the memory controller 200 may include a read operation controller 210, an over-sampling read voltage determiner 220, an error bit recovery 230, and an error corrector 240.

The read operation controller 210 is a circuit that is operable to control the plurality of memory devices 100 to perform read operations on a plurality of pages included in one stripe where a set of pages constitutes one stripe. Error correction decoding may be performed on read data obtained by performing a read operation.

In an embodiment, when a number of fail bits (erroneous bits) included in the read data is equal to or smaller than an error correction capability of an error correction decoder (e.g., the maximum number of bits the error correction decoder can correct), the error correction decoding may be determined to be successful. When the error correction decoding is successful, the read operation may be completed. When the number of erroneous data bits exceeds the maximum number of bits the error correction decoder can correct, the error correction decoding may be determined to be failed. When the error correction decoding fails, it may be determined that the read operation has been failed. The error corrector 240 based on some embodiments of the disclosed technology is a circuit that includes the error correction decoder.

In the context of this patent document, the expression "erroneous page" can indicate a page that includes erroneous data bits. The read operation controller 210 may control the plurality of memory devices 100 to perform a soft read operation on each of at least two erroneous pages among the plurality of pages. In some implementations, the soft read operation can be performed when a read operation that uses a certain read voltage as a reference voltage has failed to distinguish different threshold voltage distributions of the memory cells. As an example, the read operation using a certain read voltage to obtain quantized bit values can include a hard-decision decoding, and the soft read operation can include a soft-decision decoding that takes into account probabilistic or likelihood values rather than quantized bit values. In this regard, the "erroneous page" may be a page that has failed to decode (read out) data stored in the memory cell with a certain read voltage.

In some implementations, the soft read operation may include reading memory cells of an erroneous page using a plurality of soft read voltages determined based on a read voltage that has been used in the read operation of the erroneous page. In some implementations, the soft read operation can be performed when a hard-decision decoding has failed. In some implementations, another error correction decoding may not be performed on soft read data that is obtained by performing the soft read operation.

The read operation controller 210 may control the plurality of memory devices 100 to perform an over-sampling read operation on each of at least two erroneous pages. The over-sampling read operation may include reading memory cells of an erroneous page by using two over-sampling read voltages.

The over-sampling read voltage determiner 220 is a circuit that is designed to be operable to determine over-sampling read voltages, based on soft read data of an erroneous page. In an implementation where another error correction scheme is used before the soft read operation, the erroneous page may be a page that has failed such an error correction decoding on read data of the page. The soft read data may be data obtained by reading memory cells of an erroneous page by using a plurality of different read voltages determined and arranged based on a read voltage used in the read operation of the erroneous page.

Specifically, the over-sampling read voltage determiner 220 may count a number of memory cells belonging to a plurality of threshold voltage intervals divided using the plurality of soft read voltages, based on the soft read data.

For example, data of memory cells having threshold voltages lower than a soft read voltage may have a logic value '1,' and data of memory cells having threshold voltages higher than the soft read voltage may have a logic value '0.' Alternatively, when data of memory cells having threshold voltages lower than a soft read voltage may have the logic value '0,' and data of memory cells having threshold voltages higher than the soft read voltage may have the logic value '1.' Therefore, a number of memory cells belonging to a threshold voltage interval may be calculated using a number of ones or a number of zeros, which are included in data read using a plurality of soft read voltages.

The over-sampling read voltage determiner 220 may determine an optimum read voltage by using a number of memory cells belonging to each of the plurality of threshold voltage intervals. In the context of this patent document, the words optimal, optimized or optimum that are used in conjunction with read threshold values (read voltages) or the memory system performance are used to indicate values or conditions that provide a better performance, in some implementations, for the memory device (e.g., higher reliability, fewer detected errors, etc.) than existing read threshold values or conditions. In this sense, the words optimum, optimized or optimal are not used to describe other implementations of a memory device based on the disclosed technology in this patent document.

In an embodiment, the over-sampling read voltage determiner 220 may determine, as the optimum read voltage, a soft read voltage corresponding to a threshold voltage interval in which the least number of memory cells are situated. In another embodiment, the over-sampling read voltage determiner 220 may calculate a slope of a threshold voltage distribution curve based on a number of memory cells belonging to each of the plurality of threshold voltage intervals. The over-sampling read voltage determiner 220 may determine the optimum read voltage based on a soft read voltage corresponding to a threshold voltage interval associated with the smallest slope on the distribution curve. In some implementations, the soft read voltage corresponding to the threshold voltage interval associated with the smallest slope on the corresponding part of the threshold voltage distribution curve may be selected as the optimum read voltage.

In some implementations, the optimum read voltage may be used as a reference voltage of over-sampling read voltages. The over-sampling read voltage determiner 220 may determine over-sampling read voltages, based on the reference voltage. In some implementation, voltages adjacent to the optimum read voltage may be selected as the over-sampling read voltages. In an embodiment, the over-sampling read voltages may be higher or lower by predetermined offsets than the reference voltage. For example, the over-sampling read voltages may be determined by adding the offset to or subtracting the offset from the reference voltage. The predetermined offsets may be adjusted based on a slope of a threshold voltage distribution curve or how far the reference voltage is to the left or right on a threshold voltage distribution.

In another embodiment, the over-sampling read voltage may have a default value. The default value may be median values of two adjacent threshold voltage distributions. The reference value of the over-sampling read voltages may be situated at the valley between two overlapped threshold voltage distributions. This will be described in detail later with reference to FIG. 10.

The error bit recovery 230 may perform a soft error erase (SEE) operation. The SEE operation may be an operation of recovering error bits included in read data of at least two erroneous pages among a plurality of pages included in one stripe.

The error bit recovery 230 may recover data of an erroneous page by using read data of the other pages except the erroneous page among a plurality of pages included in one stripe. Unlike a chip kill operation which will be described later, the SEE operation may be performed even when another erroneous page is included in the other pages used to recover data of the erroneous page.

The error bit recovery 230 may determine an error estimation position or error estimation interval, based on over-sampling read data obtained by performing an over-sampling operation on an erroneous page. Data bits belonging to the error estimation interval may be error estimation bits.

For example, the error bit recovery 230 may determine an error estimation interval of read data of an erroneous page by comparing data read, using first and second over-sampling read voltages. The error bit recovery 230 may determine data bits where data read respectively using over-sampling voltages correspond to each other as data belonging to a confidence interval. The error bit recovery 230 may determine data bits where data read respectively using over-sampling read voltages different from each other as data belonging to an error estimation interval. The confidence interval and the error estimation interval may correspond to a confidence interval and a non-confidence interval, respectively. Alternatively, the confidence interval and the error estimation interval may correspond to a high confidence interval and a low confidence interval, respectively.

The error bit recovery 230 may generate recovery bits of erroneous data of an erroneous page by using data read from other pages included in one stripe. The error bit recovery 230 may generate recovery bits of erroneous data of an erroneous page by performing an XOR calculation on data bits read from the other pages in the same stripe that is associated with an interval corresponding to an error estimation interval of the other pages.

The error bit recovery 230 may replace, with the recovery bits, error estimation bits included in the erroneous data read from the erroneous page. The error bit recovery 230 may generate conversion data by replacing the error estimation bits with the recovery bits.

In various embodiments, the error bit recovery 230 may perform a chip kill operation.

The chip kill operation may include recovering data of an erroneous page (e.g., a page that has failed a read operation) included in one strip by using read data of the other pages of the stripe. Unlike the SEE operation, the chip kill operation may be performed when error correction decoding on the read data of the other pages has succeeded.

Specifically, the error correction decoding on read data and conversion data of one page among a plurality of pages fails, and the error correction decoding on read data or conversion data of the other pages except the one page among the plurality of pages succeeds.

In this case, the error bit recovery 230 may recover the read data of the one page by using the read data or conversion data of the other pages. The error bit recovery 230 may recover the read data of the erroneous page of which the error correction decoding has failed by performing an XOR calculation on the data of the other pages of which the error correction decoding has succeeded. In the context of this patent document, the expression that an error correction decoding has failed or a read operation has failed can indicate that hard-decision decoding has failed.

The error corrector 240 may perform error correction decoding on read data of a plurality of pages obtained by performing read operations on the plurality of pages. The error corrector 240 may perform the error correction decoding on conversion data. The error corrector 240 may generate Pass/Fail information on whether the result obtained by performing the error correction decoding is pass or fail (whether the error correction decoding has succeeded or failed). The error corrector 240 may perform the error correction decoding on data obtained by flipping error estimation bits included in read data of an erroneous page.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
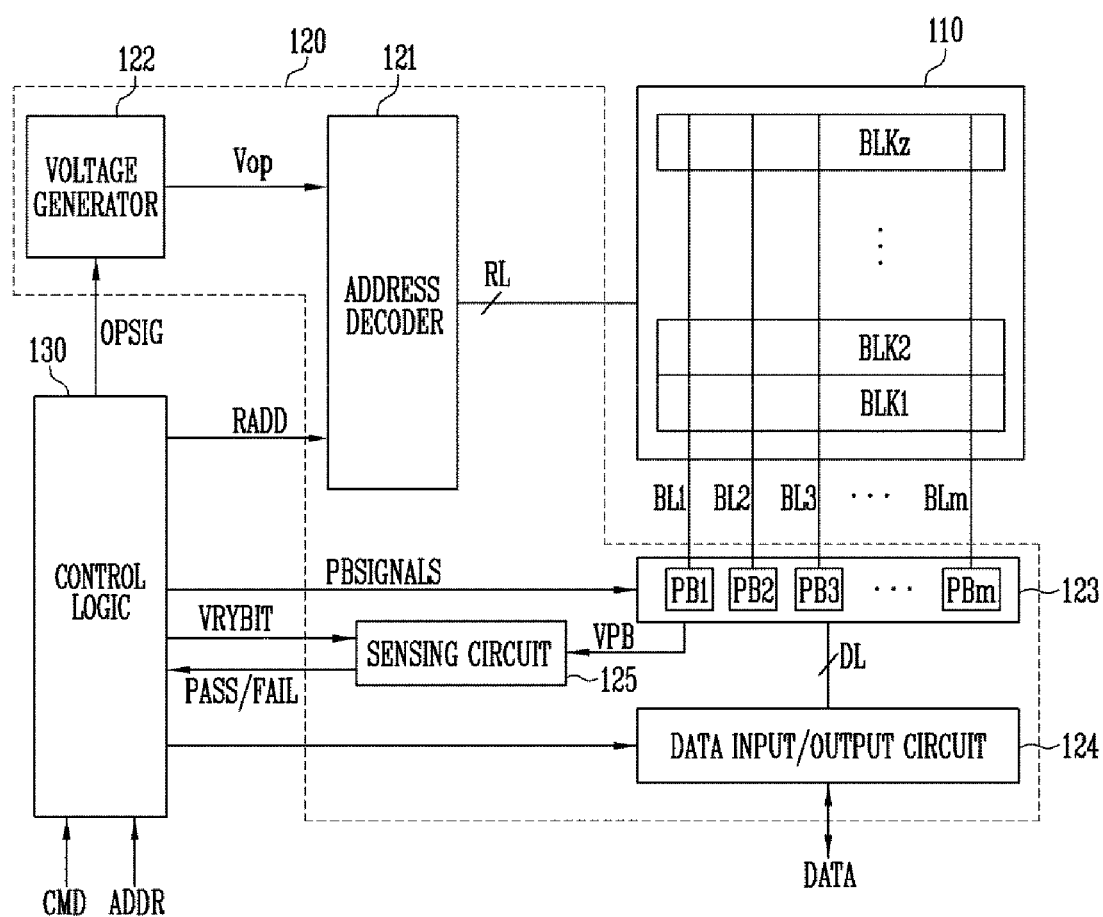
FIG. 2 is a diagram illustrating an example structure of a memory device shown in FIG. 1.

FIG. 2 is a diagram illustrating an example structure of the memory device shown in FIG. 1.

Referring to FIG. 2, the memory device 100 may include a memory cell array 100, a peripheral circuit 120, and a control logic 130.

The memory cell array 110 includes a plurality of memory blocks BLK1 to BLKz. The f memory blocks BLK1 to BLKz are coupled to an address decoder 121 through row lines RL. The memory blocks BLK1 to BLKz are coupled to a read/write circuit 123 through bit lines BL1 to BLm. Each of the plurality of memory blocks BLK1 to BLKz includes a plurality of memory cells.

In an embodiment, the plurality of memory cells may be nonvolatile memory cells. Memory cells coupled to the same word line among the plurality of memory cells may be defined as one physical page. That is, the memory cell array 110 may be configured with a plurality of physical pages. Based on an embodiment of the disclosed technology, each of the plurality of memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device may be configured as a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, a data input/output circuit 124, and a sensing circuit 125.

The peripheral circuit 120 performs the operations associated with the memory cell array 110. For example, the peripheral circuit 120 may perform a program operation, a read operation, and an erase operation on the memory cell array 110.

The address decoder 121 is coupled to the memory cell array 110 through the row lines RL. The row lines RL may include drain select lines, word lines, source select lines, and a common source line. Based on an embodiment of the disclosed technology, the word lines may include normal word lines and dummy word lines. Based on an embodiment of the disclosed technology, the row lines RL may further include a pipe select line.

The address decoder 121 may operate under the control of the control logic 130. The address decoder 121 receives an address ADDR from the control logic 130.

The address decoder 121 may decode the received address ADDR to obtain a block address. The address decoder 121 selects at least one memory block among the memory blocks BLK1 to BLKz according to the decoded block address. The address decoder 121 may decode the received address ADDR to obtain a row address RADD. The address decoder 121 may select at least one word line of the selected memory block by applying voltages provided from the voltage generator 122 to the word line WL according to the decoded row address RADD.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In an embodiment of the disclosed technology, an erase operation of the memory device 100 is performed on a memory block basis. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In an embodiment of the disclosed technology, the address decoder 121 may decode a column address in the address ADDR transmitted thereto. The decoded column address may be transmitted to the read/write circuit 123. In an example, the address decoder 121 may include a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

Figure 3:
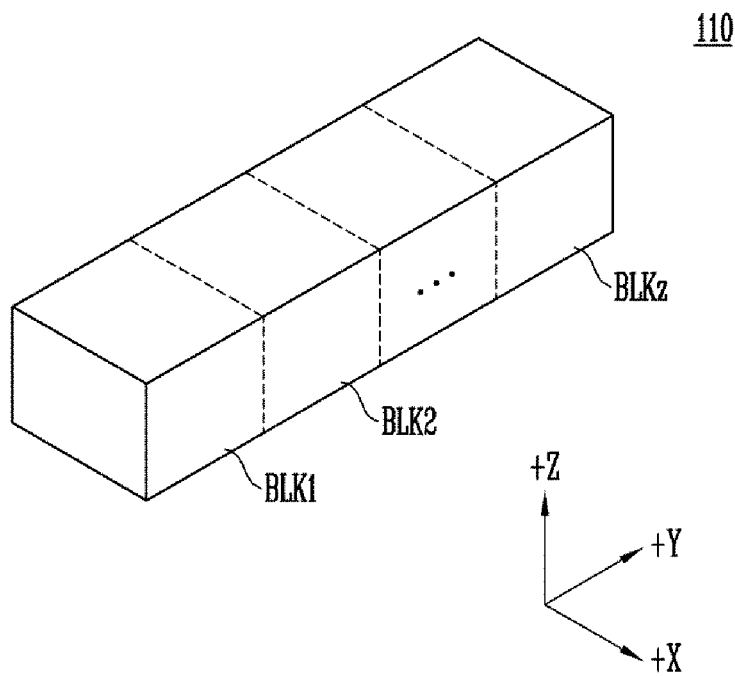
FIG. 3 is a diagram illustrating an example of a memory cell array shown in FIG. 2.

FIG. 3 is a diagram illustrating an example of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
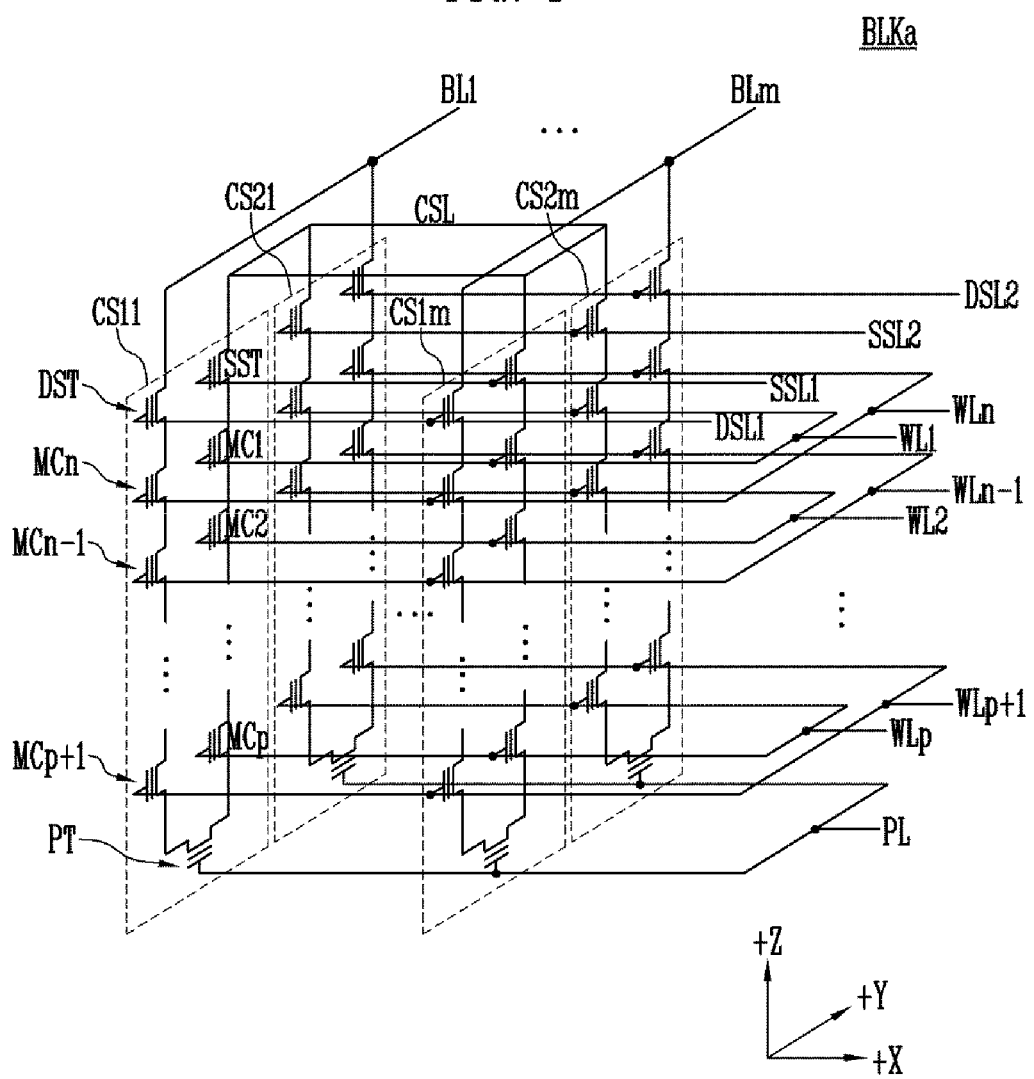
FIG. 4 is a circuit diagram illustrating an example memory block among memory blocks shown in FIG. 3.

FIG. 4 is a circuit diagram illustrating an example memory block BLKa among the memory blocks BLK1 to BLKz shown in FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MCI to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
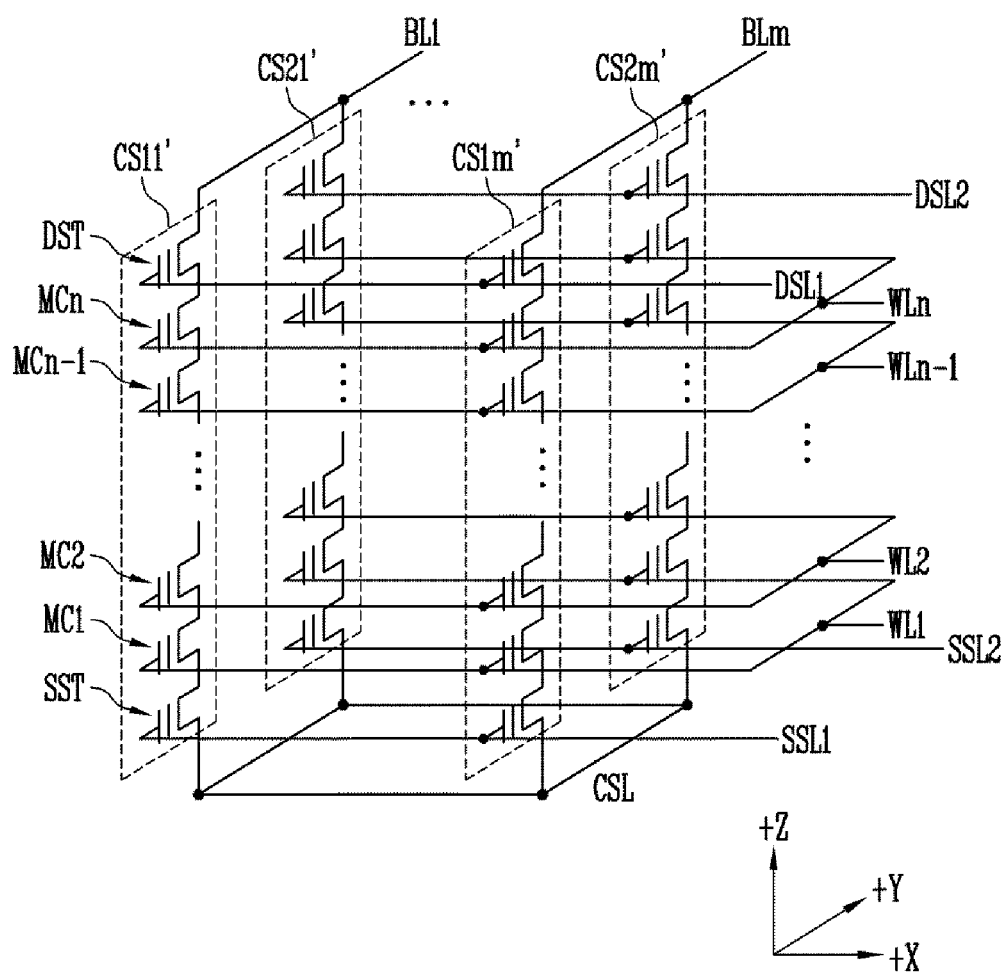
FIG. 5 is a circuit diagram illustrating another example memory block among the memory blocks shown in FIG. 3.

FIG. 5 is a circuit diagram illustrating another example BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
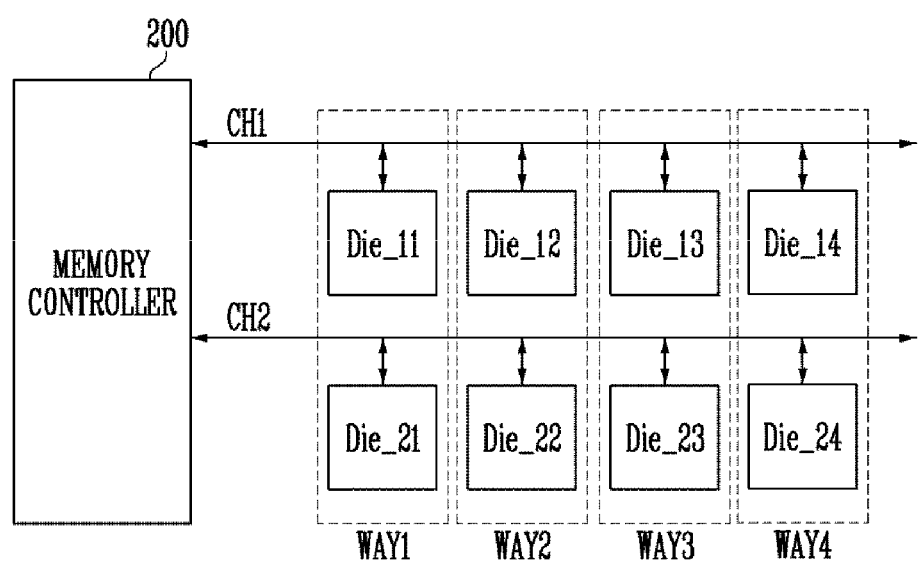
FIG. 6 is a diagram illustrating an example operation of a memory controller for controlling a plurality of memory devices.

FIG. 6 is a diagram illustrating an example operation of the memory controller for controlling a plurality of memory devices.

Referring to FIG. 6, the memory controller 200 may be coupled to a plurality of memory devices memory device_11 to memory device_24 through a first channel CH1 and a second channel CH2. The number of channels and the number of memory devices coupled to each channel are not limited to this embodiment.

Memory device_11 Die_11, memory device_12 Die_12, memory device_13 Die_13, and memory device_14 Die_14 may be commonly coupled to the first channel CH1. The memory device_11 Die_11, the memory device_12 Die_12, the memory device_13 Die_13, and the memory device_14 Die_14 may communicate with the memory controller 200 through the first channel CH1.

Since the memory device_11 Die_11, the memory device_12 Die_12, the memory device_13 Die_13, and the memory device_14 Die_14 are commonly coupled to the first channel CH1, only one memory device may communicate with the memory controller 200 at a time. However, operations internally performed respectively by the memory device_11 Die_11, the memory device_12 Die_12, the memory device_13 Die_13, and the memory device_14 Die_14 may be simultaneously performed.

Memory device_21 Die_21, memory device_22 Die_22, memory device_23 Die_23, and memory device_24 Die_24 may be commonly coupled to the second channel CH2. The memory device_21 Die_21, the memory device_22 Die_22, the memory device_23 Die_23, and the memory device_24 Die_24 may communicate with the memory controller 200 through the second channel CH2.

Since the memory device_21 Die_21, the memory device_22 Die_22, the memory device_23 Die_23, and the memory device_24 Die_24 are commonly coupled to the second channel CH2, only one memory device may communicate with the memory controller 200 at a time. However, operations internally performed respectively by the memory device_21 Die_21, the memory device_22 Die_22, the memory device_23 Die_23, and the memory device_24 Die_24 may be simultaneously performed.

The storage device using a plurality of memory devices can improve performance by using data interleaving that is data communication using the interleaving scheme. The data interleaving may be data communication in which, in a structure in which two or more ways share one channel, a data read or write operation is performed while moving between the ways. In order to achieve the data interleaving, the memory devices may be managed in units of channels and ways. In order to maximize parallelization of memory devices coupled to each channel, the memory controller 200 may distribute and allocate a continuous logical memory area to the channels and the ways.

For example, the memory controller 200 may transmit a control signal including a command and an address and data to the memory device_11 Die_11 through the first channel CH1. While the memory device_11 Die_11 is programming the transmitted data in a memory cell included therein, the memory controller 200 may transmit a control signal including a command and an address and data to the memory device_12 Die_12.

In FIG. 6, the plurality of memory devices may be configured into four ways WAY1 to WAY4. A first way WAY1 may include the memory device_11 Die_11 and the memory device_21 Die_21. A second way WAY2 may include the memory device_12 Die_12 and the memory device_22 Die_22. A third way WAY3 may include the memory device_13 Die_13 and the memory device_23 Die_23. A fourth way WAY4 may include the memory device_14 Die_14 and the memory device_24 Die_24.

Each of the channels CH1 and CH2 may be a bus of signals shared and used by memory devices coupled to the corresponding channel.

Although data interleaving in a 2-channel/4-way structure is described in FIG. 6, the efficiency of data interleaving may become more efficient as the number of channels and the number of ways become greater.

Figure 7:
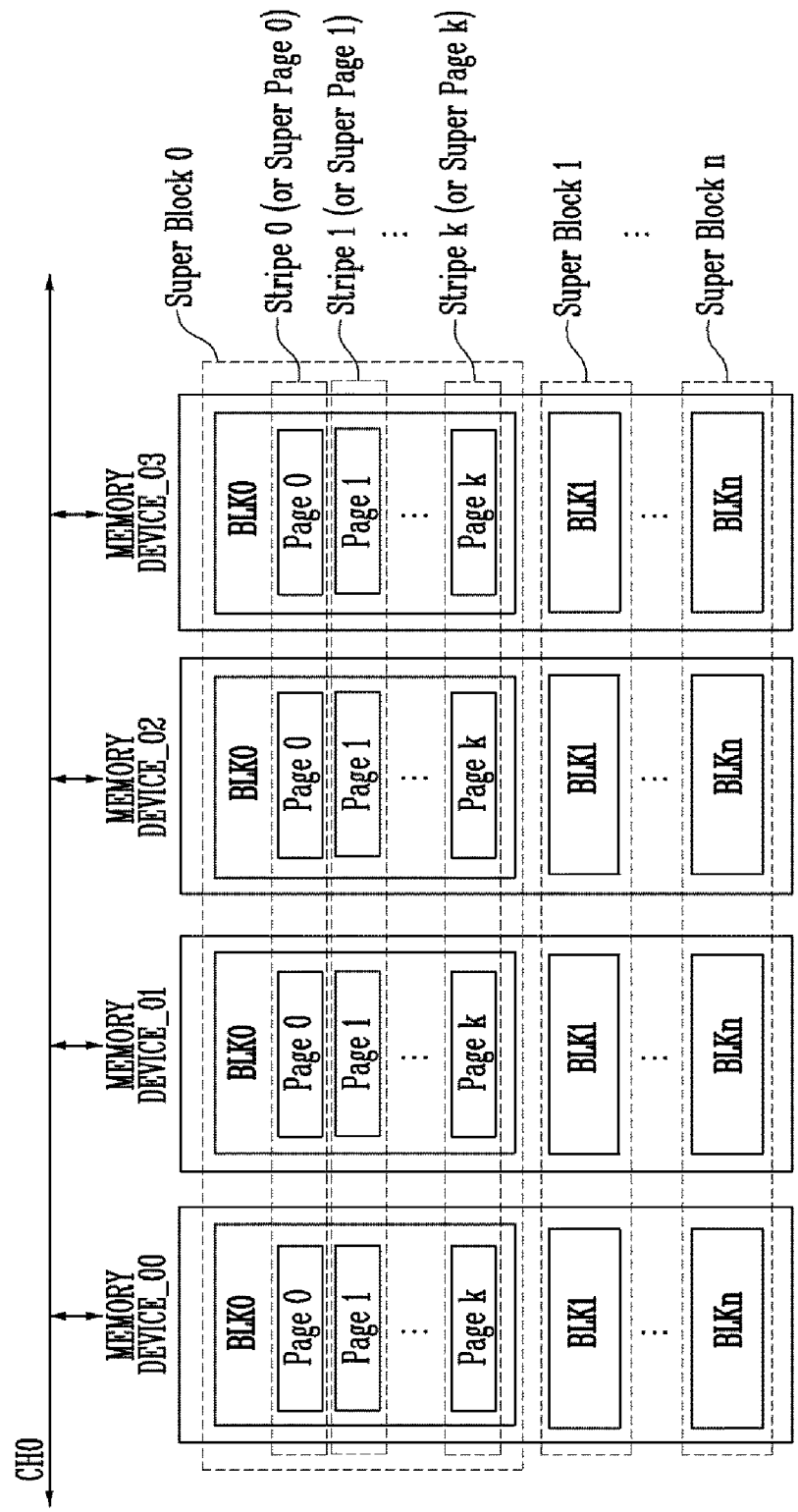
FIG. 7 is a diagram illustrating examples of a super block and a stripe.

FIG. 7 is a diagram illustrating examples of a super block and a stripe.

Referring to FIG. 7, four memory devices, i.e., memory device 00 to memory device_03 are commonly coupled to a zeroth channel CH0.

In FIG. 7, each memory device may include a plurality of planes. However, for convenience of description, a case where one memory device includes one plane is assumed. One plane included in each of the memory devices, i.e., the memory device 00 to memory device_03 may include zeroth to nth memory blocks BLK0 to BLKn, and one memory block may include zeroth to kth pages Page 0 to Page k.

The memory controller may control, in units of super blocks, memory blocks included in a plurality of memory devices commonly coupled to one channel. For example, zeroth memory blocks BLK0 included in the memory device_00 to the memory device_03 may constitute a zeroth super block Super Block 0. Therefore, the memory device_00 to the memory device_03, which are coupled to the zeroth channel CH0, may include zeroth to nth super blocks Super Block 0 to Super Block n.

One super block may be configured with a plurality of stripes. The stripe may be used mixed with the term "super page."

One stripe or super page may include a plurality of pages. For example, zeroth pages Page 0 respectively included in a plurality of zeroth memory blocks BLK0 included in the zeroth super block Super Block 0 may constitute a zeroth stripe 0 or a zeroth super page Super Page 0.

Therefore, zeroth to kth stripes Stripe 0 to Stripe k may be included in one super block. Alternatively, zeroth to kth super pages Super Page 0 to Super Page k may be included in one super block.

When the memory controller stores data in the memory device_00 to the memory device_03 or when the memory controller reads data stored in the memory device_00 to the memory device_03, the memory controller may store or read data in units of stripes or in units of super pages.

Figure 8:
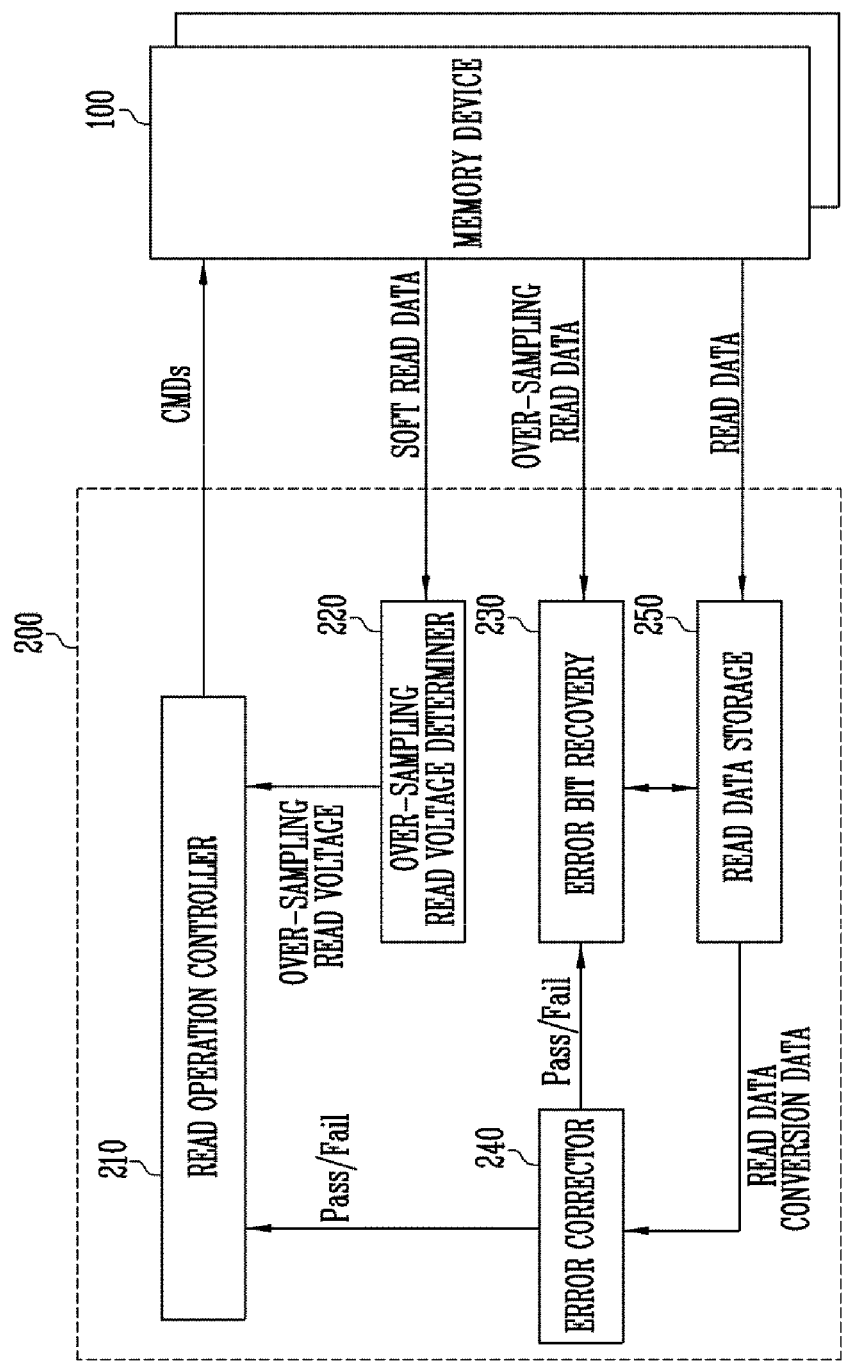
FIG. 8 is a diagram illustrating an example configuration of the memory controller based on an embodiment of the disclosed technology.

FIG. 8 is a diagram illustrating an example configuration of the memory controller based on an embodiment of the disclosed technology.

Referring to FIG. 8, the memory controller 200 may include a read operation controller 210, an over-sampling read voltage determiner 220, an error bit recovery 230, an error corrector 240, and a read data storage 250.

The read operation controller 210 may provide a plurality of memory devices 100 with read commands instructing read operations on a plurality of pages included in one stripe.

The read operation controller 210 may determine whether error correction decoding on read page of each of the plurality of pages has succeeded or failed based on Pass/Fail information provided by the error corrector 240. For example, when the error correction decoding on read data of a selected page fails, a read operation on the selected page may be determined to be failed. When the error correction decoding on read data of a selected page passes, the read operation on the selected page may be determined to be successful.

The read operation controller 210 may provide the plurality of memory devices 100 with a soft read command instructing a soft read operation on each of at least two pages of which read operations fail among the plurality of pages. The error correction decoding may not be performed on soft read data obtained by performing the soft read operation.

The read operation controller 210 may provide the plurality of memory devices 100 with an over-sampling read command instructing an over-sampling read operation on each of at least two pages of which read operations fail. The over-sampling read operation may include reading memory cells in an erroneous page by using two over-sampling read voltages.

The over-sampling read voltage determiner 220 may determine over-sampling read voltages, based on soft read data of an erroneous page. The soft read data may be acquired from the plurality of memory devices 100 by performing a soft read command.

The erroneous page may include a page that has one or more erroneous data bits the error correction decoding has failed to recover the erroneous data bits. The soft read data may be data obtained by reading memory cells of an erroneous page by using a plurality of read voltages determined based on a read voltage used in the read operation of the erroneous page.

Specifically, the over-sampling read voltage determiner 220 may count a number of memory cells belonging to a plurality of threshold voltage intervals divided using a plurality of soft read voltages, based on the soft read data. A number of memory cells belonging to a threshold voltage interval may be calculated using a number of ones or a number of zeros, which are included in data read using a plurality of soft read voltages.

The over-sampling read voltage determiner 220 may determine an optimum read voltage by using a number of memory cells belonging to each of the plurality of threshold voltage intervals.

The over-sampling read voltage determiner 220 may determine the determined optimum read voltage as a reference voltage of over-sampling read voltages. The over-sampling read voltage determiner 220 may determine over-sampling read voltages, based on the reference voltage.

In another embodiment, the over-sampling read voltage may have a default value. The default value may be a median value of both threshold voltage distributions divided based on a reference value of the over-sampling read voltages. This will be described in detail later with reference to FIG. 10.

The error bit recovery 230 may perform a Soft Error Erase (SEE) operation. The SEE operation may be an operation of recovering error bits included in read data of at least two pages of which read operations fail among a plurality of pages included in one stripe.

The error bit recovery 230 may determine whether the error correction decoding on read data or conversion data, which is stored in the read data storage 250, based on Pass/Fail information provided by the error corrector 240.

The error bit recovery 230 may determine an error estimation position or error estimation interval, based on over-sampling read data obtained by performing an over-sampling operation on an erroneous page. Data bits belonging to the error estimation interval may be error estimation bits. The over-sampling read data may be acquired from the plurality of memory devices 100 obtained by performing an over-sampling read command.

For example, the error bit recovery 230 may determine an error estimation interval of read data of an erroneous page by comparing data read, using first and second over-sampling read voltages.

The error bit recovery 230 may generate recovery bits of erroneous data of an erroneous page by using data read from other pages included in one stripe. The error bit recovery 230 may generate recovery bits of erroneous data of an erroneous page by performing an XOR calculation on data bits read from the other pages in the same stripe that is associated with an interval corresponding to an error estimation interval of the other pages.

The error bit recovery 230 may replace, with the recovery bits, error estimation bits included in the erroneous data read from an erroneous page. The error bit recovery 230 may generate conversion data by replacing the error estimation bits with the recovery bits, and store the generated conversion data in the read data storage 250.

In various embodiments, the error bit recovery 230 may perform a chip kill operation. Specifically, the error correction decoding on read data and conversion data of one page among a plurality of pages fails, and the error correction decoding on read data or conversion data of the other pages except the one page among the plurality of pages succeeds.

In this case, the error bit recovery 230 may recover the read data of the one page by using the read data or conversion data of the other pages. The error bit recovery 230 may recover the read data of the erroneous page of which the error correction decoding has failed by performing an XOR calculation on the data of the other pages of which the error correction decoding has succeeded.

The error corrector 240 may perform error correction decoding on read data of a plurality of pages obtained by performing read operations on the plurality of pages. The error corrector 240 may perform the error correction decoding on conversion data. The error corrector 240 may generate Pass/Fail information on whether the result obtained by performing the error correction decoding is pass or fail. The error corrector 240 may provide the generated Pass/Fail information to the read operation controller 210 and the error bit recovery 230.

The read data storage 250 may store read data of a plurality of pages, which are acquired from the plurality of memory devices 100. Read data of some pages among the plurality of pages may be data of which the error correction decoding fails.

The read data storage 250 may store conversion data. The conversion data may be data obtained by replacing error estimation bits included in read data of an erroneous page with recovery bits.

Figure 9:
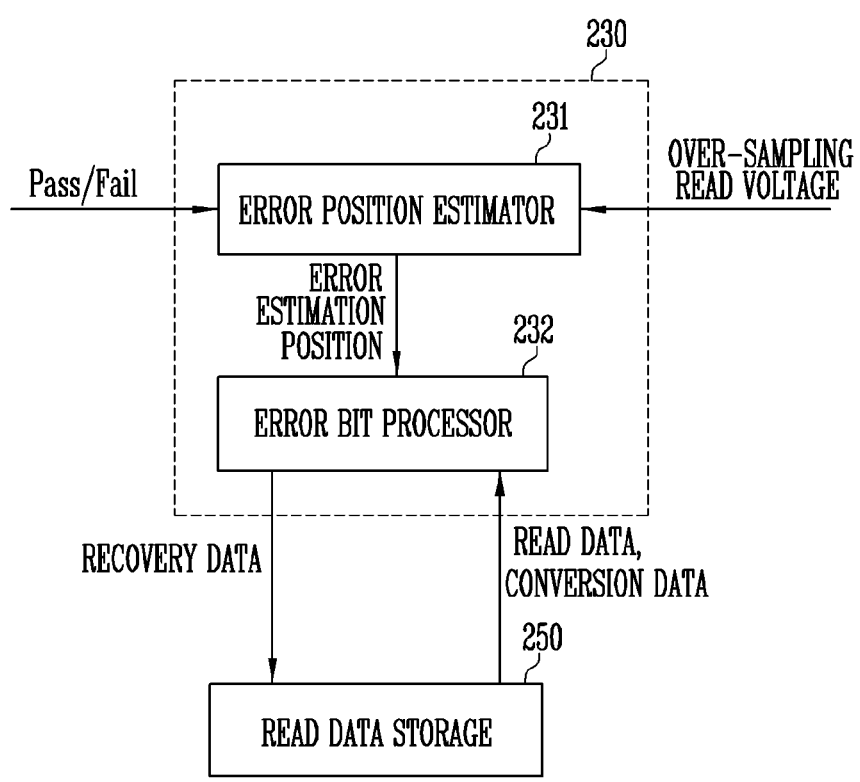
FIG. 9 is a diagram illustrating an example configuration of error bit recovery circuitry shown in FIG. 8.

FIG. 9 is a diagram illustrating an example configuration of the error bit recovery circuitry shown in FIG. 8.

Referring to FIG. 9, the error bit recovery 230 may include an error position estimator 231 and an error bit processor 232.

The error bit recovery 230 may perform a Soft Error Erase (SEE) operation. The SEE operation may be an operation of recovering error bits included in read data of at least two pages of which read operations fail among a plurality of pages included in one stripe.

The error position estimator 231 may determine whether error correction decoding on read data or conversion data, which is stored in the read data storage 250, passes or fails, based on the Pass/Fail information provided by the error corrector described with reference to FIG. 8.

The error position estimator 231 may determine an error estimation position or error estimation interval, based on over-sampling read data obtained by performing an over-sampling read operation on an erroneous page. Data bits belonging to the error estimation interval may be error estimation bits. The over-sampling read data may be acquired from the plurality of memory devices 100 described with reference to FIG. 6.

For example, the error position estimator 231 may determine an error estimation interval of read data of an erroneous page by comparing data read using first and second over-sampling read voltages. The error position estimator 231 may determine data bits where data read respectively using over-sampling voltages correspond to each other as data belonging to a confidence interval. The error position estimator 231 may determine data bits where data read respectively using over-sampling read voltages different from each other as data belonging to an error estimation interval.

The error position estimator 231 may provide the error bit processor 232 with information on the error estimation position (or error estimation interval) determined based on the over-sampling read data.

The error bit processor 232 may generate recovery bits by performing an XOR calculation on data bits of an interval corresponding to an error estimation interval, which are included in the read data of the other pages.

The error bit processor 232 may replace error estimation bits included in read data of an erroneous page with recovery bits. The error bit processor 232 may generate, as conversion data, the read data obtained by replacing the error estimation bits with the recovery bits, and store the generated conversion data in the read data storage 250.

In various embodiments, the error bit processor 232 may perform a chip kill operation. Specifically, the error correction decoding on read data and conversion data of one page among a plurality of pages fails, and the error correction decoding on read data or conversion data of the other pages except the one page among the plurality of pages succeeds.

In this case, the error bit processor 232 may recover the read data of the one page by using the read data or conversion data of the other pages. The error bit recovery 230 may generate recovery data corresponding to the read data of the page of which the error correction decoding has failed by performing an XOR calculation on the data of the other pages of which the error correction decoding has succeeded.

FIG. 10 is a diagram illustrating examples of a read voltage and an over-sampling read voltage.

The curves (a) shown in FIG. 10 illustrate threshold voltage distributions of aingle level cells (SLCs) (storing one bit of data per cell). A threshold voltage of an SLC may have one of an erase state ER and a program state P1.

In reading data from the SLC memory cells, a read voltage Vrd1 may be used to distinguish the erase state ER from the program state P1. An SLC having the erase state ER may be read as an "on"-cell when the SLC is read using the read voltage Vrd1. An SLC having the program state P1 may be read as an "off"-cell when the SLC is read using the read voltage Vrd1. The "on"/"off" cell may indicate that a cell transistor is turned on/off when the read voltage is applied.

In an embodiment, a default value of a first over-sampling read voltage OVS1 may be a median value of a threshold voltage corresponding to the erase operation ER. Alternatively, the default value of the first over-sampling read voltage OVS1 may be an x-axis value of the threshold voltage distribution corresponding to the maximum y-axis value (e.g., peak value) of the threshold voltage distribution corresponding to the erase state ER.

A default value of a second over-sampling read voltage OVS2 may be a median value of a threshold voltage distribution corresponding to the program state P1. Alternatively, the default value of the second over-sampling read voltage OVS2 may be an x-axis value of the threshold voltage distribution corresponding to the maximum y-axis value (e.g., peak value) of the threshold voltage distribution corresponding to the program state P1.

The curves (b) shown in FIG. 10 illustrate threshold voltage distributions of multi-level cells (MLCs) (storing two bits of data per cell). A threshold voltage of an MLC may have one of an erase state ER and first to third program states P1 to P3.

In reading data from the MLC memory cells, first to third read voltages Vrd1 to Vrd3 may be used to distinguish the erase state and the first to third program states P1 to P3 from each other. The first read voltage Vrd1 may be used to distinguish the erase state ER from the first program state P1. The second read voltage Vrd2 may be used to distinguish the first program state P1 from the second program state P2. The third read voltage Vrd3 may be used to distinguish the second program state P2 from the third program state P3.

Each MLC may have one of the erase state ER and the first to third program state P1 to P3, and which state each MLC is in can be determined using the first to third read voltages Vrd1 to Vrd3.

In an embodiment, default values of first to fourth over-sampling read voltages OVS1 to OVS4 may be median values of threshold voltage distributions corresponding to the erase state ER and the first to third program states P1 to P3, respectively.

Alternatively, the default values of the first to fourth over-sampling read voltages OVS1 to OVS4 may be x-axis values of the threshold voltage distributions corresponding to the erase state ER and the first to third program states P1 to P3 when the maximum y-axis values (e.g., peak value) of the threshold voltage distributions corresponding to the erase state ER and the first to third program states P1 to P3, respectively.

In various embodiments, this scheme can be applied to other cases where each memory cell stores three or more bits of data.

Figure 11:
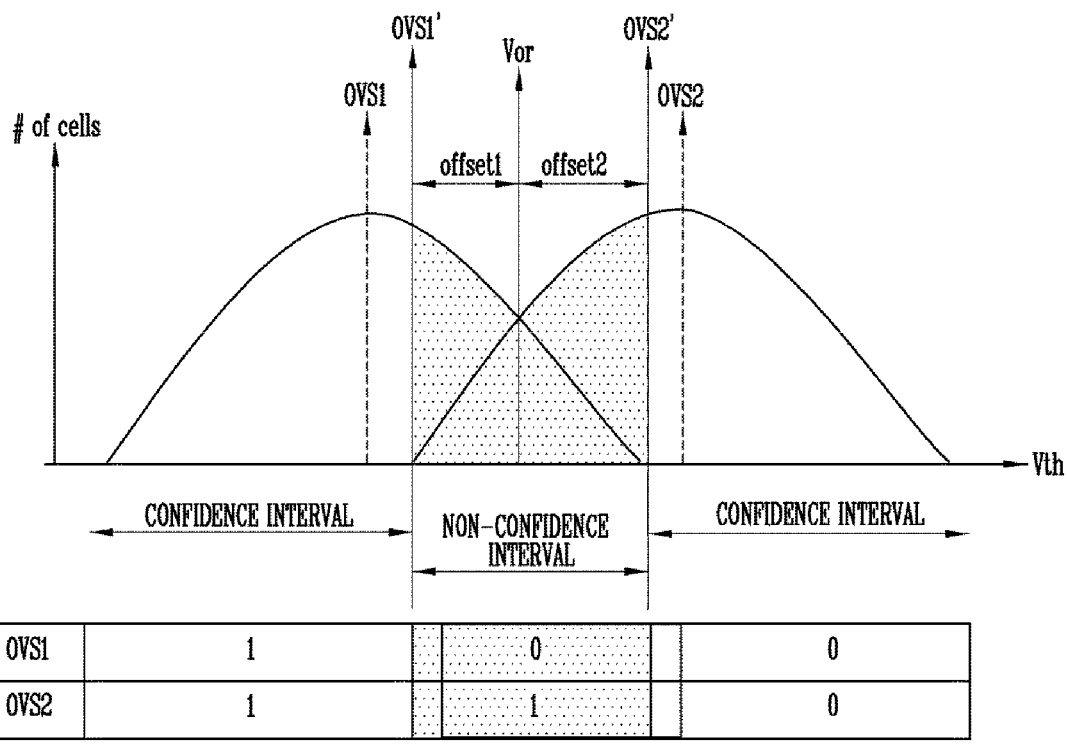
FIG. 11 is a diagram illustrating an example operation of determining an over-sampling read voltage based on an embodiment of the disclosed technology.

FIG. 11 is a diagram illustrating an example operation of determining an over-sampling read voltage based on an embodiment of the disclosed technology.

Referring to FIG. 11, first and second over-sampling read voltages OVS1 and OVS2 indicated by dotted lines may be the over-sampling read voltages having the default values, which are described with reference to FIG. 10. First and second over-sampling read voltages OVS1' and OVS2' indicated by solid lines may be over-sampling read voltages determined (or adjusted) based on a result obtained by performing a soft read operation based on the embodiment of the disclosed technology.

The over-sampling read voltages may have values increased or decreased by predetermined offsets from a reference voltage. In an embodiment, the reference voltage may be an optimum read voltage for reading memory cells of an erroneous page. For example, as shown in FIG. 11, the reference voltage may be situated at the valley between two adjacent overlapped threshold voltage distributions.

For example, the first over-sampling read voltage OVS1' indicated by the solid line may have a value decreased by a first offset offset1 from an optimum read voltage Vor as the reference voltage. The second over-sampling read voltage OVS2' may have a value increased by a second offset offset2 from the optimum read voltage Vor as the reference voltage. The first and second offsets offset1 and offset2 may have the same magnitude. In alternative embodiments, the first and second offsets offset1 and offset2 may have different magnitudes.

In an embodiment, an over-sampling read operation may include determining a confidence interval or a non-confidence interval, based on over-sampling read data obtained by reading memory cells, using two over-sampling read voltages.

In an embodiment, at an interval from a left edge of a left threshold voltage distribution to a left edge of a right threshold voltage distribution, both the threshold voltage distributions do not overlap with each other, and hence the degree of confidence at this interval is high. At an interval from a right edge of the left threshold voltage distribution to a right edge of the right threshold voltage distribution, both the threshold hold voltage do not overlap with each other, and hence the degree of confidence at this interval is also high. The interval at which the degree of confidence is high may be called a confidence interval.

At an interval from the left edge of the right threshold voltage distribution to the right edge of the left threshold voltage distribution, both the threshold hold voltage overlap with each other, and hence the degree of confidence at this interval is low. The interval at which the degree of confidence is low may be called a non-confidence interval or error estimation interval.

When the SEE operation described with reference to FIG. 8 is performed, it is important to set intervals between adjacent over-sampling read voltages. When the interval between the over-sampling read voltages accurately approaches the closest approximation of the error estimation interval as the non-confidence interval, it may be highly likely that error correction decoding on error estimation bits belonging to the error estimation interval will be successful. Thus, error data recovery performance can be improved.

For example, when the over-sampling read operation is performed using the second over-sampling read voltage OVS2 having the default value, the read operation will be performed on a right side further deviated from the right edge of the left threshold voltage distribution. When the over-sampling read operation is performed using the first over-sampling read voltage OVS1 having the default value, the read operation will be performed on a left side further deviated from the left edge of the right threshold voltage distribution. Therefore, the interval between the first and second over-sampling read voltages OVS1 and OVS2 having the default values does not match an actual non-confidence interval. Accordingly, the accuracy of over-sampling read data obtained by performing the over-sampling read operation is low, and hence the error data recovery performance may be relatively low.

On the contrary, the interval between the first and second over-sampling read voltages OVS1' and OVS2' set based on the reference voltage Vor determined by performing the soft read operation is more similar to the non-confidence interval. Accordingly, the accuracy of over-sampling read data obtained by performing the over-sampling read operation is high, and hence the error data recovery performance may be relatively high.

Thus, when the over-sampling read operation is performed using over-sampling read voltages determined based on the result obtained by performing the soft read operation, instead of using over-sampling read voltages having default values, the error data recovery performance can be improved.

Figure 12:
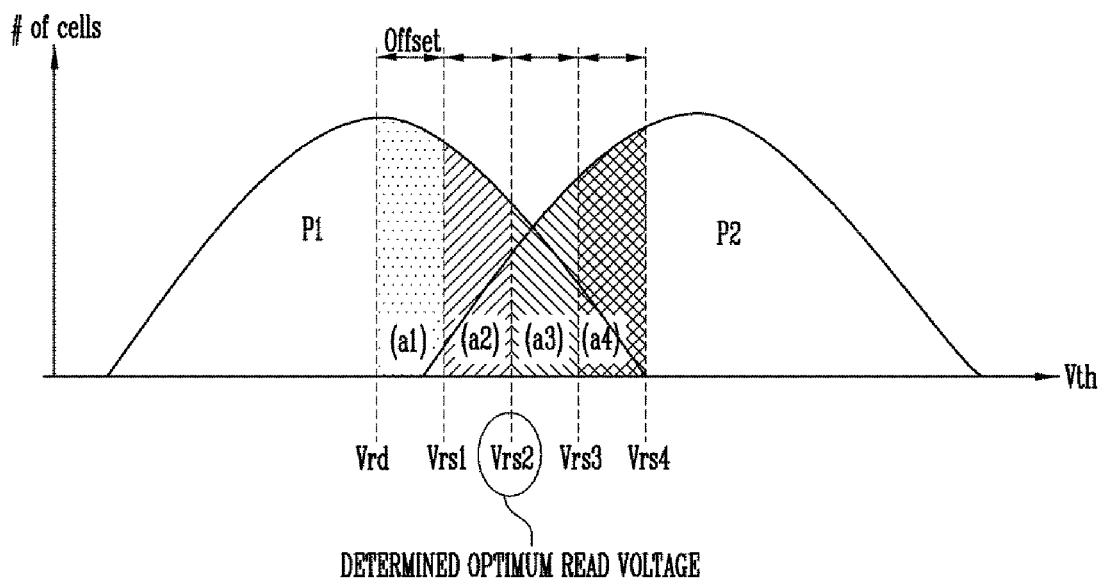
FIG. 12 is a diagram illustrating an example operation of determining a reference voltage shown in FIG. 11.

FIG. 12 is a diagram illustrating an example operation of determining the reference voltage shown in FIG. 11.

Referring to FIG. 12, the reference voltage shown in FIG. 11 may be an optimum read voltage for distinguishing two threshold voltage distributions from each other.

A read voltage Vrd may be a read voltage used in a read operation of an erroneous page. Whether the read operation fails may be determined according to a result obtained by performing error correction decoding on read data of the erroneous page.

Since the read voltage Vrd is located at a left side from a valley between the threshold voltage distribution corresponding to the first program state P1 and the threshold voltage distribution corresponding to the second program state P2, the read voltage Vrd is not fit to be used as a read voltage for distinguishing the first program state P1 from the second program state P2.

Some embodiments of the disclosed technology can be used to determine an optimum read voltage for distinguishing the first program state P1 from the second program state P2.

In an embodiment, a plurality of soft read voltages may be determined based on a read voltage at which the read operation has failed. The plurality of soft read voltages may be determined by increasing or decreasing from such a "failed" read voltage by an interval corresponding to a predetermined offset. In various embodiments, the plurality of soft read voltages may be spaced apart from one another at the interval corresponding to the predetermined offset.

For example, first to fourth soft read voltages Vrs1 to Vrs4 increased at an interval corresponding to a predetermined offset from the read voltage Vrd (e.g., failed read voltage). Although FIG. 12 illustrates four soft read voltages, it should be noted that the number of soft read voltages determined based on the read voltage can vary.

A soft read operation includes reading memory cells of an erroneous page using a plurality of soft read voltages. The error correction decoding may not be performed on soft read data, which has been obtained by performing the soft read operation.

First to fourth threshold voltage distributions a1 to a4 may be distinguished using the read voltage Vrd and the first to fourth soft read voltages Vrs1 to Vrs4. A number of memory cells included in each of the first to fourth threshold voltage distributions a1 to a4 may be counted based on the soft read data.

For example, data of memory cells having threshold voltages lower than the soft read voltage may have a logic value '1,' and data of memory cells having threshold voltages higher than the soft read voltage may have a logic value '0.' Therefore, a number of memory cells belonging to a threshold voltage interval may be calculated using a number of ones or a number of zeros included in data read using a plurality of soft read voltages.

The optimum read voltage may be determined as soft read voltage corresponding to an interval at which the number of memory cells belonging to the threshold voltage distribution among the plurality of soft read voltages is smallest. For example, the second soft read voltage Vrs2 corresponding to interval a3 at which the number of memory cells belonging to the threshold voltage distribution among the first to fourth soft read voltages Vrs1 to Vrs4 is smallest may be determined as the optimum read voltage.

In an embodiment, the optimum read voltage may be determined as a soft read voltage corresponding to an interval at which the slope of a distribution curve determined based on the number of memory cells belonging to each of a plurality of threshold voltage intervals is smallest or greatest.

In some implementations, where the threshold voltage distributions are divided into a plurality of intervals (or sections), the interval with the minimum slope or the interval with the maximum slope may be selected and the read voltage associated with the selected interval may be selected as the optimum read voltage. In FIG. 12, since the interval (a3) has the maximum slope, the second soft read voltage Vrs2 may be selected as the optimum read voltage. In some implementations, the optimum read voltage may be selected based on the absolute value of the slope of the interval, and in FIG. 12, the interval a3 is selected because it is steeper than the other intervals a1, a2, and a4.

Figure 13:
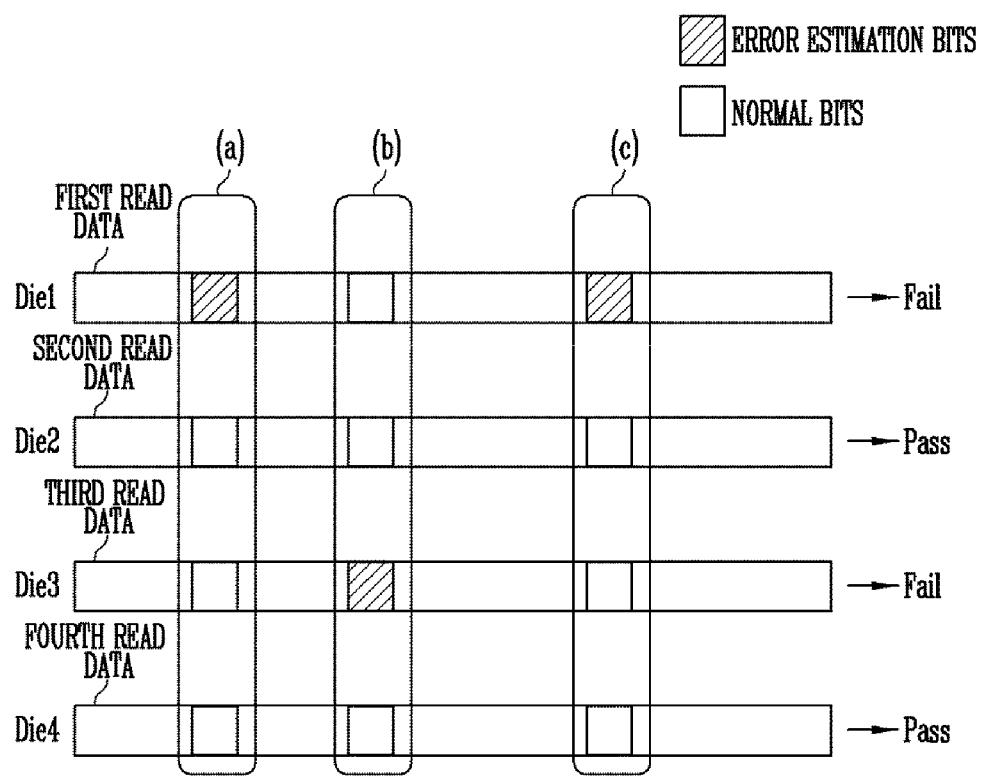
FIG. 13 is a diagram illustrating an example of a Soft Error Erase (SEE) operation based on an embodiment of the disclosed technology.

FIG. 13 is a diagram illustrating an example of a soft error erase (SEE) operation based on an embodiment of the disclosed technology.

Referring to FIG. 13, first to fourth read data may be obtained by reading pages included in first to fourth memory devices Die1 to Die4, respectively. The pages respectively included in the first to fourth memory devices Die1 to Die4 may constitute one stripe described with reference to FIG. 7.

In an embodiment, any one page among a plurality of pages included in one stripe may store data obtained by performing an XOR operation on data stored in the other pages except the one page among the plurality of pages.

In FIG. 13, a slashed portion may represent error estimation bits belonging to an error estimation interval, which are included in read data. An unslashed portion may represent normal bits belonging to a confidence interval included in the read data.

"Pass" represents that error correction decoding on read data has successfully recovered the read data. "Fail" represents that the error correction decoding on the read data has failed to recover the read data. Therefore, the first and third read data may indicate erroneous data that has failed to recover by the error correction decoding. The second and fourth data may indicate data that has recovered by the error correction decoding.

Unlike the chip kill operation, the SEE operation involves an error recovery operation that may be performed even when read operations have failed with respect to two or more pages in one stripe.

For example, error estimation bits belonging to error estimation interval (a) of the first read data may be replaced with recovery bits obtained by performing an XOR operation on normal bits of an interval corresponding to the error estimation interval (a) included in each of the other second to fourth read data.

Error estimation bits belonging to error estimation interval (b) of the third read data may be replaced with recovery bits obtained by performing an XOR operation on normal bits of an interval corresponding to the error estimation interval (b) included in the other first, second, and fourth read data.

Error estimation bits belonging to error estimation interval (c) of the first read data may be replaced with recovery bits obtained by performing an XOR operations on normal bits of an interval corresponding to the error estimation interval (c) included in the other second to fourth read data.

Data obtained by replacing error estimation bits included in read data with recovery bits may be defined as conversion data. The error correction decoding may be performed on conversion data. When the error correction decoding on the conversion data has succeeded, this represents that error estimation bits included in previous read data are normally recovered as normal bits.

In an embodiment, the SEE operation and the error correction decoding may be repeatedly performed for a predetermined number of iterations. The conversion data with the successful error correction decoding may be used in the next SEE operation, instead of the existing read data.

For example, data obtained by replacing error estimation bits belonging to the error estimation interval (b) of the third read data with recovery bits may correspond to third conversion data. When the error correction decoding on the third conversion data is successful, it is determined that data bits located at the error estimation interval (b) included in the third conversion data are normal bits.

Therefore, the SEE operation may be performed using the recovered third conversion data instead of the third read data in the SEE operation of the next loop.

Figure 14:
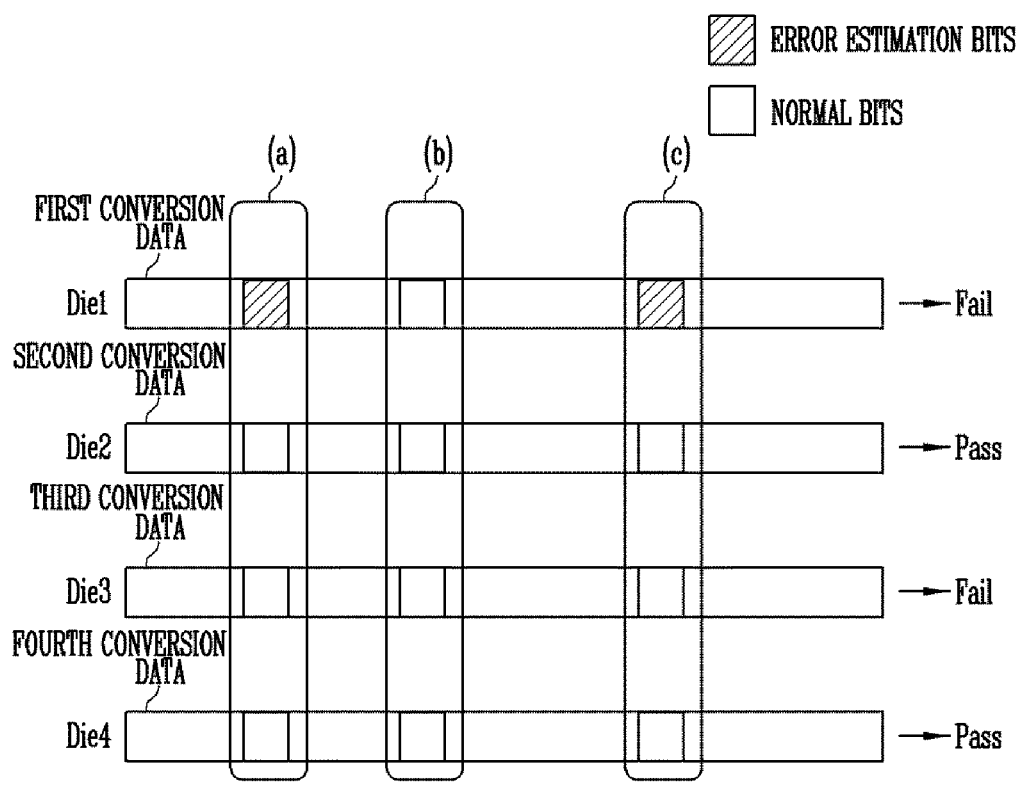
FIG. 14 is a diagram illustrating an example of a chip kill operation based on an embodiment of the disclosed technology.

FIG. 14 is a diagram illustrating an example of a chip kill operation based on an embodiment of the disclosed technology.

Referring to FIGS. 13 and 14, first to fourth conversion data may correspond to the first to fourth read data, respectively.

The second and fourth conversion data may be identical to the second and fourth read data, which have previously succeeded on the error correction decoding. The third conversion data may be data recovered by performing the SEE operation on the third read data, which has previously failed the error correction decoding but has succeeded in the current error correction decoding. Therefore, data bits located at the error estimation interval (b) included in the third conversion data may be normal bits.

The first conversion data may be data recovered by performing the SEE operation on the first read data of which the error correction decoding previously failed. Since the first conversion data is data of which the error correction decoding fails, data bits located at the error estimation intervals (a) and (c) included in the first conversion data may be still error estimation bits.

The chip kill operation is an error data recovery operation that can be performed when the error correction decoding on data of only one page among a plurality of pages included in one stripe fails while the error correction decoding on the other pages except the one page among the plurality of pages succeeds. Unlike the SEE operation, in the chip kill operation, the error data recovery operation may be performed in units of some data chunks included in a page. In the chip kill operation, the error data recovery operation may be performed in units of all page data.

Since the first to fourth read data shown in FIG. 13 are data where the error correction decoding on the first and third read data fails, the SEE operation on the first and third read data may be performed instead of the chip kill operation. As a result of performing the SEE operation, the first to fourth read data may be recovered as the first to fourth conversion data.

Since the error correction decoding has failed with respect to only the first conversion data, the error data recovery operation can be performed using the chip kill error correction scheme. The first read data of which the error correction decoding has failed may be recovered using recovery data obtained by performing an XOR calculation on the second to fourth conversion data. In this way, original data stored in a page included in the first memory device Die1, which corresponds to the first read data, may be recovered.

Figure 15:
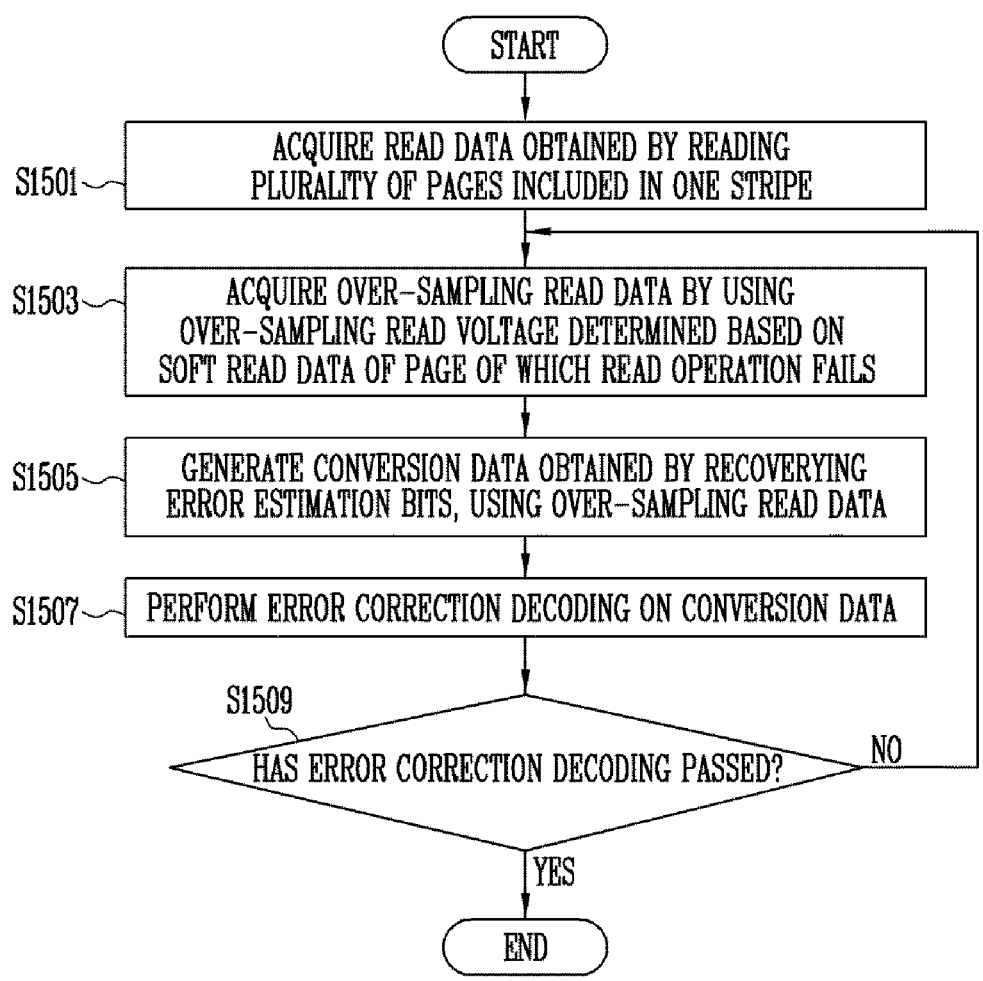
FIG. 15 is a flowchart illustrating an example operation of the memory controller based on an embodiment of the disclosed technology.

FIG. 15 is a flowchart illustrating an example operation of the memory controller based on an embodiment of the disclosed technology.

Referring to FIG. 15, in step S1501, the memory controller may acquire data obtained by reading a plurality of pages included in one stripe from a plurality of memory devices. The plurality of pages may be respectively included in different memory devices among the plurality of memory devices.

In step S1503, the memory controller may acquire over-sampling read data by using an over-sampling read voltage determined based on soft read data of an erroneous page. Whether the read operation passes or fails may be determined based on a result obtained by performing error correction decoding on read data of the corresponding page.

In step S1505, the memory controller may generate conversion data obtained by recovering error estimation bits, using the over-sampling read data.

In step S1507, the memory controller may perform the error correction decoding on the conversion data.

In step S1509, the memory controller may determine whether the error correction decoding has passed. As the determination result, when the error correction decoding passes, the operation may be ended. When the error correction decoding does not pass, the operation may proceed to the step S1503. In an embodiment, the error correction decoding may be repeatedly performed by a predetermined threshold number of times.

Figure 16:
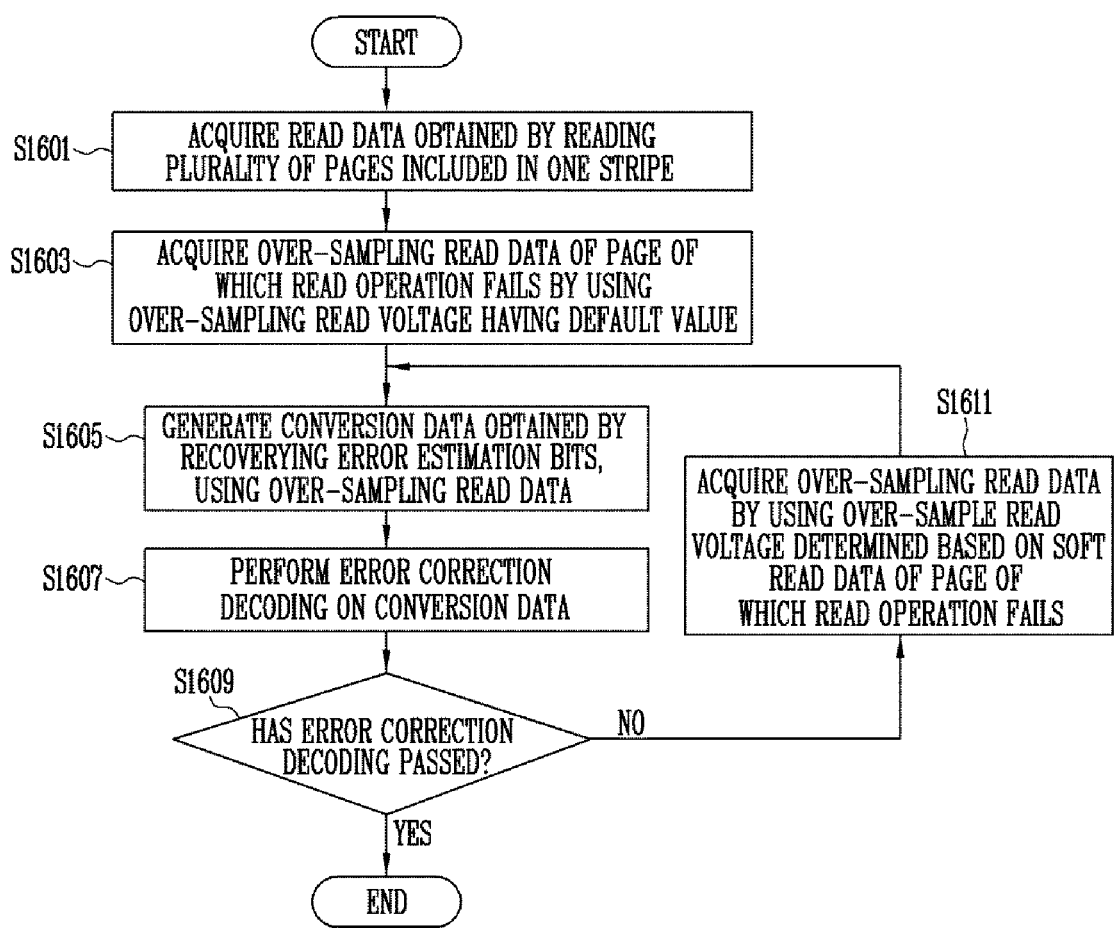
FIG. 16 is a flowchart illustrating an example operation of the memory controller based on another embodiment of the disclosed technology.

FIG. 16 is a flowchart illustrating an example operation of the memory controller based on another embodiment of the disclosed technology.

Referring to FIG. 16, in step S1601, the memory controller may acquire data obtained by reading a plurality of pages included in one stripe from a plurality of memory devices. The plurality of pages may be respectively included in different memory devices among the plurality of memory devices.

In step S1603, the memory controller may acquire over-sampling read data of an erroneous page by using an over-sampling read voltage having a default value.

In step S1605, the memory controller may generate conversion data obtained by recovering error estimation bits, using the over-sampling read data.

In step S1607, the memory controller may perform error correction decoding on the conversion data.

In step S1609, the memory controller may determine whether the error correction decoding has passed. As the determination result, when the error correction decoding passes, the operation may be ended. When the error correction decoding does not pass, the operation may proceed to step S1611. In an embodiment, the error correction decoding may be repeatedly performed by a predetermined threshold number of times.

In step S1611, the memory controller may acquire over-sampling read data by using an over-sampling read voltage determined based on soft read data of an erroneous page. Whether the read operation passes or fails may be determined based on a result obtained by performing the error correction decoding on read data of the corresponding page.

Figure 17:
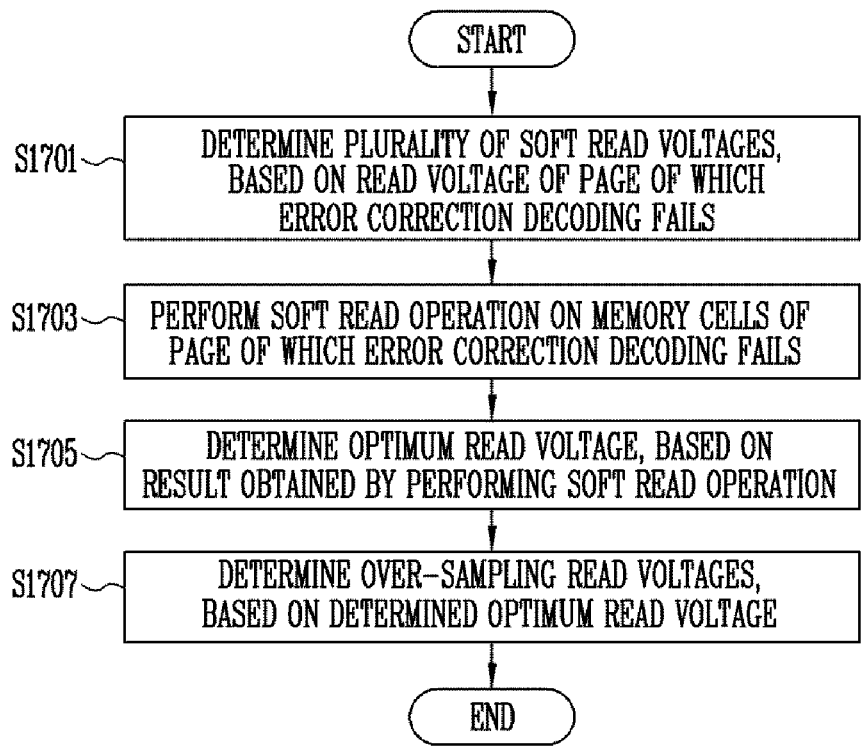
FIG. 17 is a flowchart illustrating an example operation of determining an over-sampling read voltage based on an embodiment of the disclosed technology.

FIG. 17 is a flowchart illustrating an example operation of determining an over-sampling read voltage based on an embodiment of the disclosed technology.

Referring to FIG. 17, in step S1701, the memory controller may determine a plurality of soft read voltages, based on a read voltage on a page of which error correction decoding fails. The page of which the error correction decoding may be a page in which the read operation on the corresponding page fails.

In step S1703, the memory controller may control a plurality of memory devices to perform a soft read operation on memory cells of the page of which the error correction decoding fails.

In step S1705, the memory controller may determine an optimum read voltage, based on a result obtained by performing the soft read operation.

In step S1707, the memory controller may determine over-sampling read voltages, based on the determined optimum read voltage. For example, the optimum read voltage may be a reference voltage of over-sampling read voltages. The over-sampling read voltages may have values further increased or decreased by predetermined offsets than the reference voltage.

Figure 18:
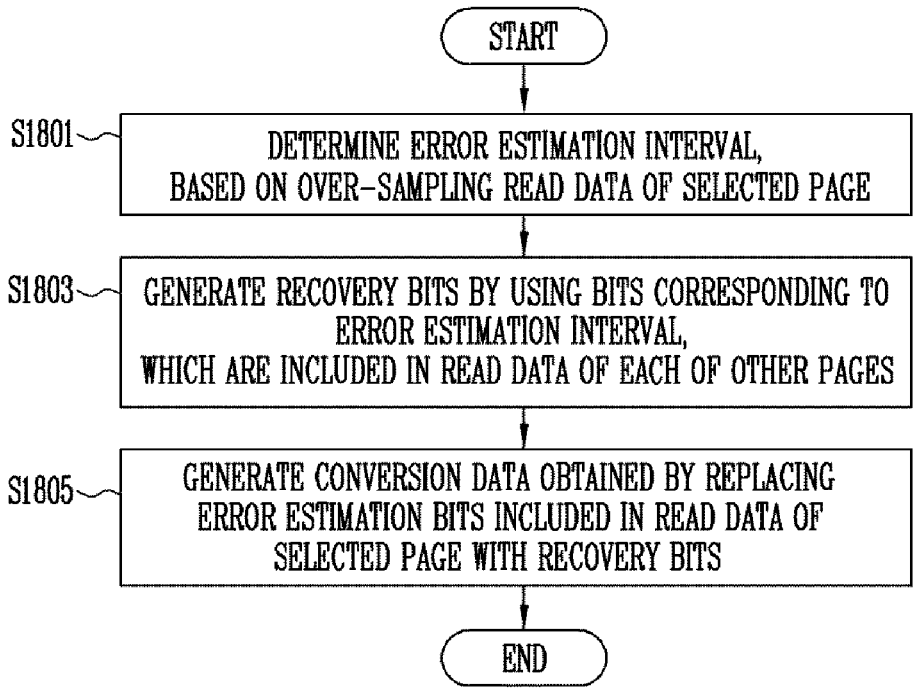
FIG. 18 is a flowchart illustrating an example of an error bit recovery operation based on an embodiment of the disclosed technology.

FIG. 18 is a flowchart illustrating an example of an error bit recovery operation based on an embodiment of the disclosed technology.

Referring to FIG. 18, in step S1801, the memory controller may determine data belonging to an error estimation interval, which is included in read data of a selected page, based on an over-sampling read data of the selected page. The over-sampling read data may be data acquired from a plurality of memory devices as a result of performing an over-sampling read operation on the selected page. The selected page may be any one of at least two pages among a plurality of pages included in one stripe, when read operations on the at least two pages fail.

In step S1803, the memory controller may generate recovery bits by using bits corresponding to an error estimation interval, which are included in read data of each of the other pages among the plurality of pages.

In step S1805, the memory controller may generate conversion data obtained by replacing error estimation bits included in the read data of the selected page with the recovery bits.

Figure 19:
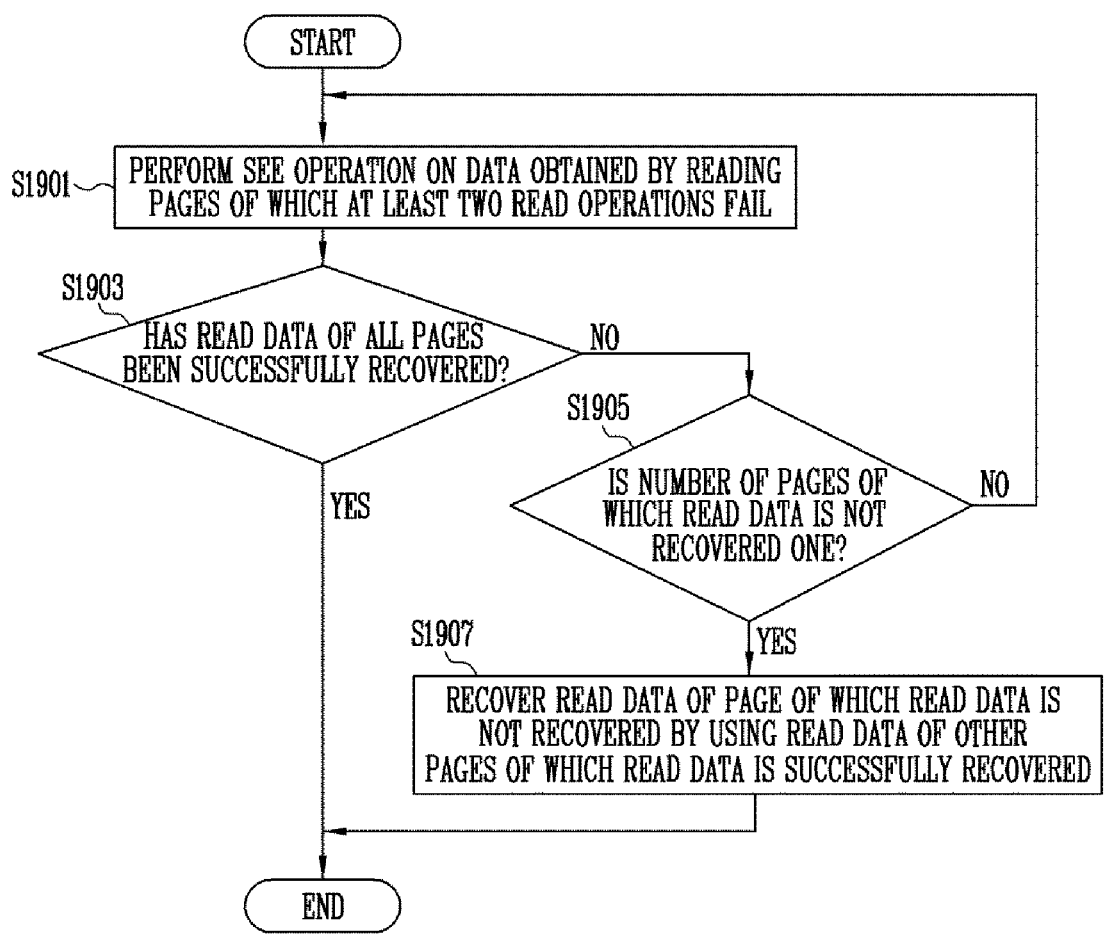
FIG. 19 is a flowchart illustrating an example of a chip kill operation based on an embodiment of the disclosed technology.

FIG. 19 is a flowchart illustrating an example of a chip kill operation based on an embodiment of the disclosed technology.

Referring to FIG. 19, in step S1901, the memory controller may perform a Soft Error Erase (SEE) operation on data obtained by reading pages of which at least two read operations fail among a plurality of pages included in one stripe.

In step S1903, the memory controller may determine whether read data of all the pages included in the one stripe has been successfully recovered. As the determination result, when the read data of all the pages is successfully recovered, the operation may be ended. When the read data of all the pages is not successfully recovered, the operation may proceed to step S1905.

In step S1905, the memory controller may determine whether the number of pages of which read data is not recovered among the plurality of pages is one. As the determination result, when the number of pages of which the read data is not recovered among the plurality of pages is one, the operation proceeds to step 1907. When the number of pages of which the read data is not recovered among the plurality of pages is not one, the operation proceeds to the step 1901.

In the step S1907, the memory controller may recover read data of page of which read data is not recovered by using read data of the other pages of which read data is successfully recovered among the plurality of pages. Specifically, recovery data corresponding to the read data of which the read data is not recovered by performing an XOR calculation on the read data of the other pages of which the read data is successfully recovered.

Figure 20:
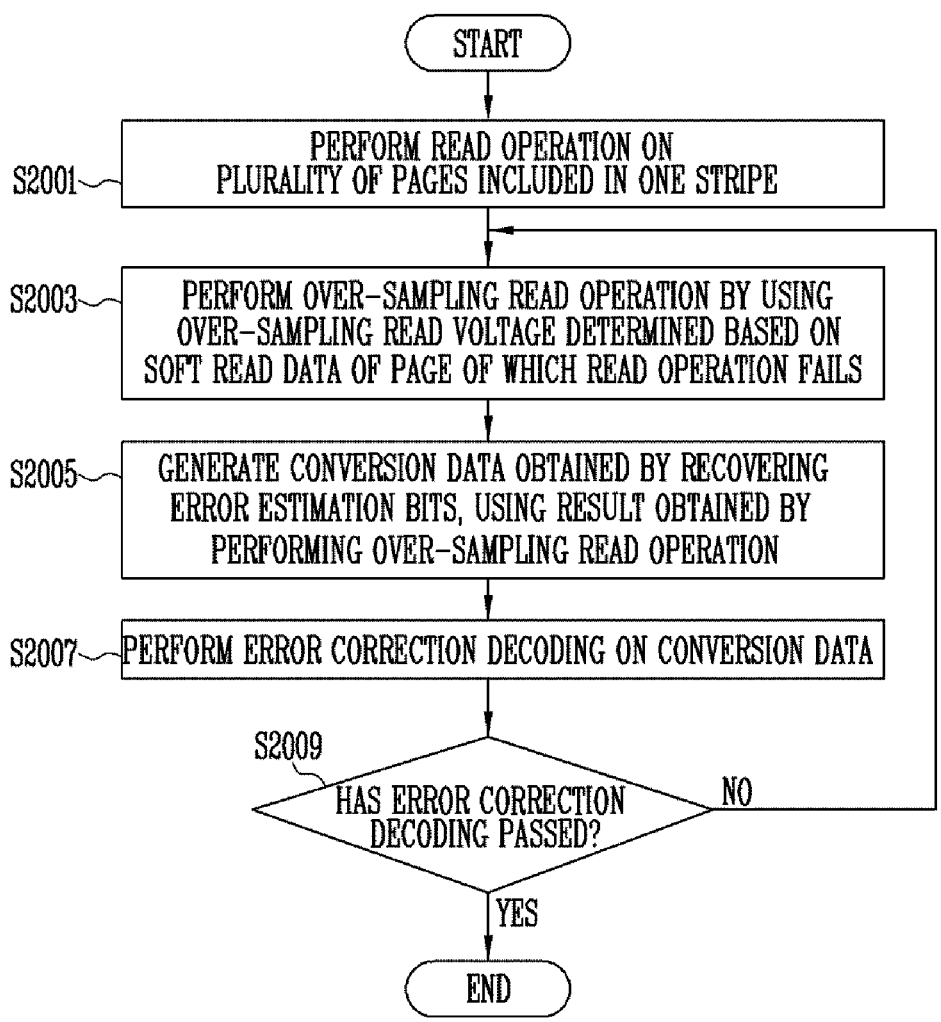
FIG. 20 is a flowchart illustrating an example operation of the storage device based on an embodiment of the disclosed technology.

FIG. 20 is a flowchart illustrating an example operation of the storage device based on an embodiment of the disclosed technology.

Referring to FIG. 20, in step S2001, the storage device may perform a read operation on a plurality of pages included in one stripe. The plurality of pages may be respectively included in different memory devices among a plurality of memory devices included in the storage device.

In step S2003, the storage device may perform an over-sampling read operation by using an over-sampling read voltage determined based on soft read data of an erroneous page.

In step S2005, the storage device may generate conversion data obtained by recovering error estimation bits, using over-sampling read data obtained by performing the over-sampling read operation.

In step S2007, the storage device may perform error correction decoding on the conversion data.

In step S2009, the storage device may determine whether the error correction decoding has passed. As the determination result, when the error correction decoding passes, the operation may be ended. When the error correction decoding does not pass, the operation may proceed to the step S2003. In an embodiment, the error correction decoding may be repeatedly performed by a predetermined threshold number of times.

Figure 21:
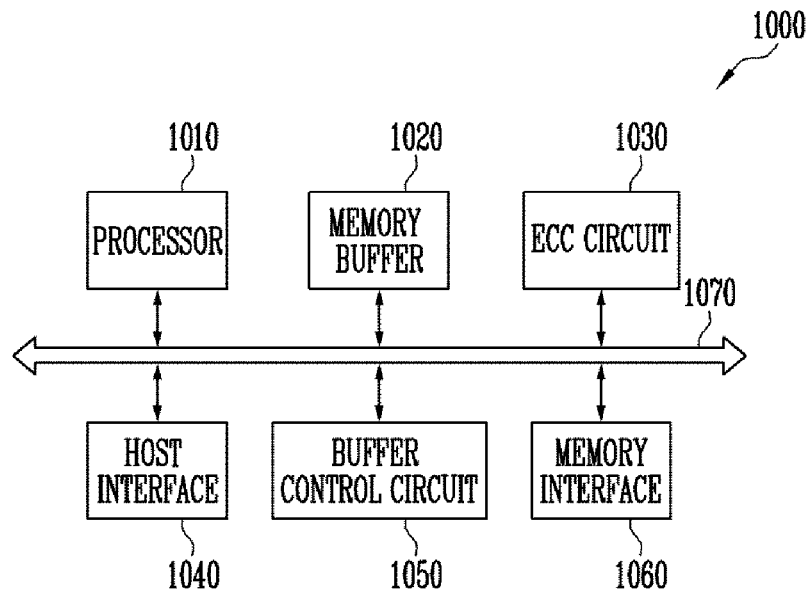
FIG. 21 is a diagram illustrating another example of the memory controller shown in FIG. 1.

FIG. 21 is a diagram illustrating another example of the memory controller shown in FIG. 1.

Referring to FIG. 21, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to perform a series of operation defined by firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 22:
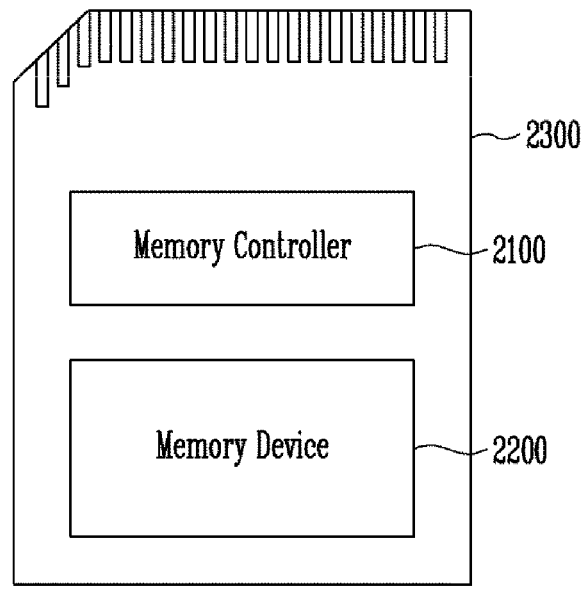
FIG. 22 is a block diagram illustrating an example of a memory card system to which the storage device is applied based on an embodiment of the disclosed technology.

FIG. 22 is a block diagram illustrating an example of a memory card system to which the storage device is applied based on an embodiment of the disclosed technology.

Referring to FIG. 22, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to perform a series of operation defined by firmware for controlling the memory device 2200. The memory controller 2100 may be implemented identically to the memory controller 200 described with reference to FIG. 1.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 23:
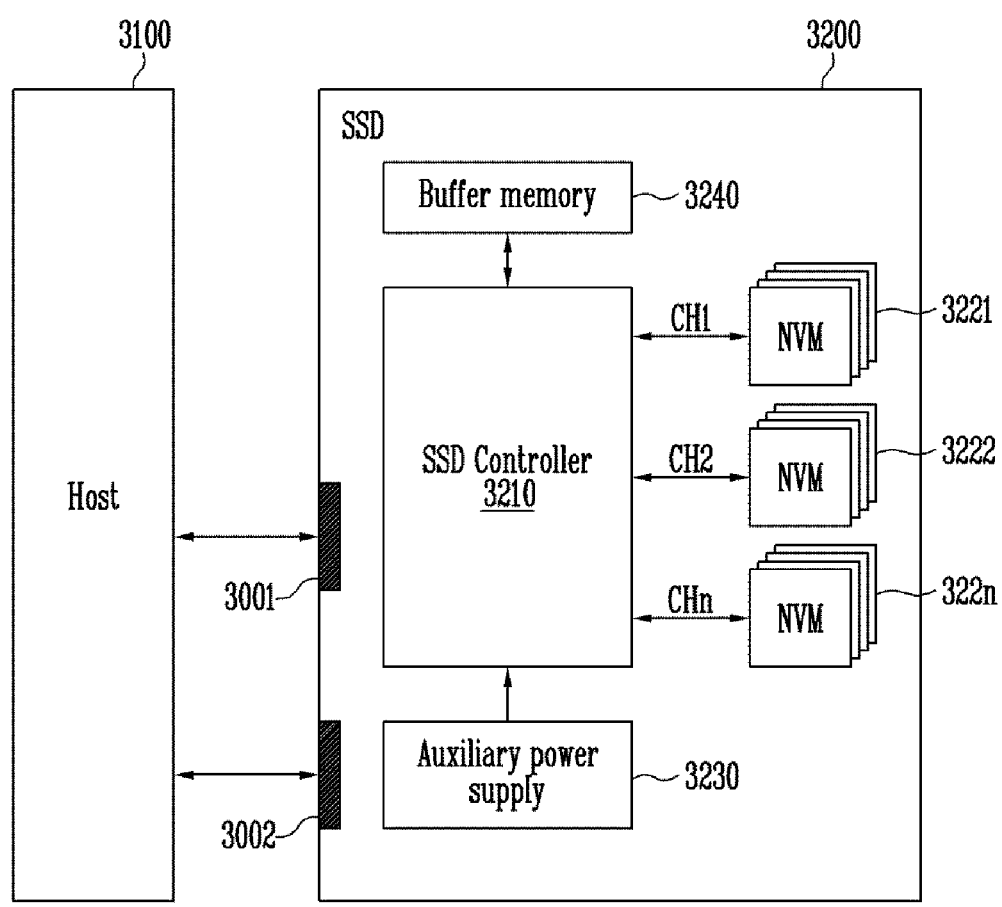
FIG. 23 is a block diagram illustrating an example of a Solid State Drive (SSD) system to which the storage device is applied based on an embodiment of the disclosed technology.

FIG. 23 is a block diagram illustrating an example of a Solid State Drive (SSD) system to which the storage device is applied based on an embodiment of the disclosed technology.

Referring to FIG. 23, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 24:
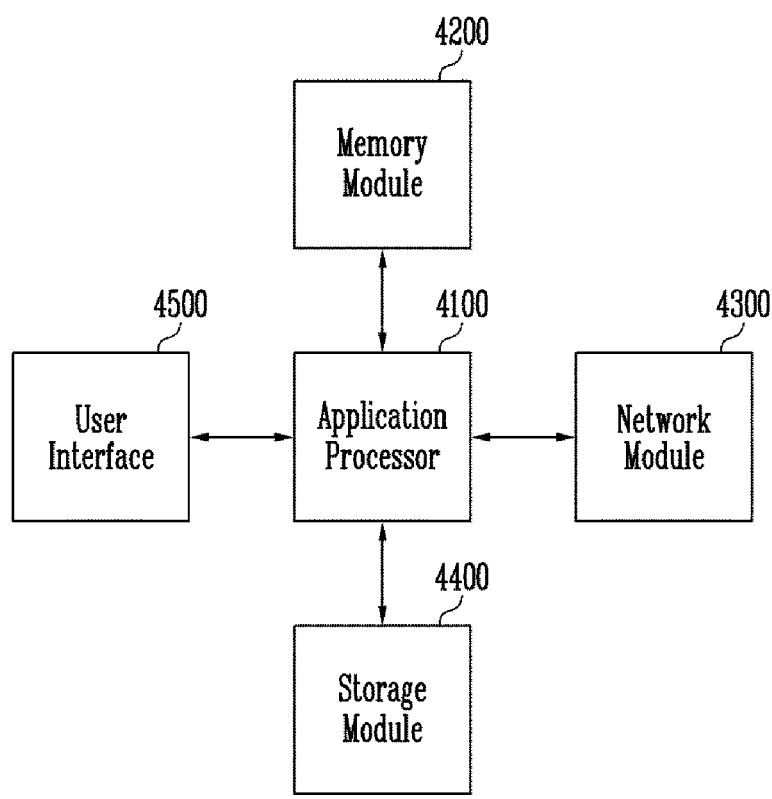
FIG. 24 is a block diagram illustrating an example of a user system to which the storage device is applied based on an embodiment of the disclosed technology.

FIG. 24 is a block diagram illustrating an example of a user system to which the storage device is applied based on an embodiment of the disclosed technology.

Referring to FIG. 24, the user system 4000 includes an application processor 4100, a memory module 4200, a network module 4300, a storage module 4400, and a user interface 4500.

The application processor 4100 may perform the operations associated with components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

What is claimed is:

1. A memory controller for controlling a plurality of memory devices, the memory controller comprising:
    a read operation controller configured to control the plurality of memory devices to perform a read operation on a plurality of pages included in one stripe of the plurality of memory devices;
    an over-sampling read voltage determiner configured to determine over-sampling read voltages, based on soft read data of a selected page among at least two pages, when read operations on the at least two pages among the plurality of pages fail;
    an error bit recovery configured to recover error estimation bits included in read data of the selected page, based on an over-sampling read data of the selected page acquired using the over-sampling read voltages; and
    an error corrector configured to perform error correction decoding on conversion data obtained by recovering the error estimation bits included in the read data of the selected page.

2. The memory controller of claim 1, wherein the plurality of pages are respectively included in different memory devices among the plurality of memory devices, and
    wherein any one page among the plurality of pages stores data obtained by performing an exclusive OR (XOR) operation on data stored in the other pages except the one page among the plurality pages.

3. The memory controller of claim 1, wherein the over-sampling read voltage determiner determines a reference voltage of the over-sampling read voltages, based on the soft read data,
    wherein the over-sampling read voltages have values higher or lower by predetermined offsets than the reference voltage.

4. The memory controller of claim 3, wherein the soft read data is obtained by reading memory cells of the selected page, using a plurality of soft read voltages determined based on a read voltage used in a read operation on the selected page.

5. The memory controller of claim 4, wherein the reference voltage is an optimum read voltage determined using a number of memory cells belonging to each of a plurality of threshold voltage intervals divided using the plurality of soft read voltages.

6. The memory controller of claim 5, wherein the optimum read voltage is a soft read voltage corresponding to a threshold voltage interval to which the least number of memory cells belong among the plurality of threshold voltage intervals.

7. The memory controller of claim 5, wherein the optimum read voltage is a soft read voltage corresponding to a threshold voltage interval associated with the smallest or largest slope on a distribution curve determined based on the number of memory cells belonging to each of the plurality of threshold voltage intervals.

8. The memory controller of claim 2, wherein the error bit recovery divides the read data of the selected page into data belonging to a confidence interval and data belonging to an error estimation interval, based on the over-sampling read data.

9. The memory controller of claim 8, wherein the error corrector reverses the error estimation bits belonging to the error estimation interval, and performs error correction decoding on the read data of the selected page, which includes the reversed error estimation bits.

10. The memory controller of claim 8, wherein the error bit recovery generates recovery bits by using data bits of an interval corresponding to the error estimation interval, which are included in read data of each of the other pages except the selected page among the plurality of pages.

11. The memory controller of claim 10, wherein the error bit recovery replaces the error estimation bits belonging to the error estimation interval with the recovery bits.

12. The memory controller of claim 11, further comprising a read data storage configured to store read data of each of the plurality of pages obtained by performing the read operations, and store the conversion data obtained by replacing the error estimation bits included in the read data of the selected page with the recovery bits.

13. The memory controller of claim 2, wherein the error corrector performs error correction decoding on read data of each of the plurality of pages obtained by performing the read operations, and determines whether each of the read operations has succeeded or failed, based on a result obtained by performing the error correction decoding.

14. The memory controller of claim 13, wherein the error bit recovery generates recovery data corresponding to read data of one page among the plurality of pages by using read data or conversion date of the other pages, when the error correction decoding on the read data and the conversion data of the one page of the plurality of pages fails, and the error correction decoding on the read data or the conversion data of the other pages except the one page succeeds.

15. A storage device comprising:
    a plurality of memory devices; and
    a memory controller in communication with the plurality of memory devices to perform read operation on a plurality of pages included in one stripe of the plurality of memory devices, determine over-sampling read voltages, based on soft read data of a selected page among at least two pages, when read operations on the at least two pages among the plurality of pages fail, recover error estimation bits included in read data of the selected page, based on an over-sampling read data of the selected page acquired using the over-sampling read voltages, and perform error correction decoding on conversion data obtained by recovering the error estimation bits included in the read data of the selected page.

16. The storage device of claim 15, wherein the plurality of pages are respectively included in different memory devices among the plurality of memory devices, and
wherein any one page among the plurality of pages stores data obtained by performing an exclusive OR (XOR) calculation on data stored in the other pages except the one page among the plurality pages.

17. The storage device of claim 15, wherein the memory controller determines a reference voltage of the over-sampling read voltages, based on the soft read data,
wherein the over-sampling read voltages have values higher or lower by predetermined offsets than the reference voltage.

18. The storage device of claim 17, wherein the soft read data is obtained by reading memory cells of the selected page, using a plurality of soft read voltages determined based on a read voltage used in a read operation on the selected page,
wherein the reference voltage is an optimum read voltage determined using a number of memory cells belonging to each of a plurality of threshold voltage intervals divided using the plurality of soft read voltages.

19. The storage device of claim 15, wherein the memory controller:
divides the read data of the selected page into data belonging to a confidence interval and data belonging to an error estimation interval, based on the over-sampling read data;
generates recovery bits by using data bits of an interval corresponding to the error estimation interval, which are included in read data of each of the other pages except the selected page among the plurality of pages; and
generating the conversion data as data obtained by replacing the error estimation bits included in the read data of the selected page with the recovery bits.

20. The storage device of claim 19, wherein the memory controller:
determines whether each of the read operations passes or fails, based on a result obtained by performing error correction decoding on read data of each of the plurality of pages by performing the read operations; and
generates recovery data corresponding to read data of one page among the plurality of pages by using read data or conversion date of the other pages, when the error correction decoding on the read data and the conversion data of the one page of the plurality of pages fails, and the error correction decoding on the read data or the conversion data of the other pages except the one page succeeds.

* * * * *